US012648345B2

(12) United States Patent
Lee et al.

(10) Patent No.: US 12,648,345 B2
(45) Date of Patent: Jun. 2, 2026

(54) ORGANIC PHOTODETECTOR AND ELECTRONIC DEVICE HAVING THE SAME

(71) Applicant: Samsung Display Co., Ltd., Yongin-si (KR)

(72) Inventors: Daeho Lee, Yongin-si (KR); Dongkyu Seo, Yongin-si (KR); Junyong Shin, Yongin-si (KR); Byeongwook Yoo, Yongin-si (KR); Seokgyu Yoon, Yongin-si (KR); Byungseok Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 713 days.

(21) Appl. No.: 17/828,296

(22) Filed: May 31, 2022

(65) Prior Publication Data

US 2022/0399513 A1 Dec. 15, 2022

(30) Foreign Application Priority Data

Jun. 1, 2021 (KR) ........................ 10-2021-0070965

(51) Int. Cl.

| | |
|---|---|
| ***H10K 30/20*** | (2023.01) |
| ***H10K 30/30*** | (2023.01) |
| ***H10K 39/34*** | (2023.01) |
| ***H10K 65/00*** | (2023.01) |
| ***H10K 85/30*** | (2023.01) |
| ***H10K 85/60*** | (2023.01) |

(Continued)

(52) U.S. Cl.

CPC ............. *H10K 65/00* (2023.02); *H10K 30/20* (2023.02); *H10K 30/30* (2023.02); *H10K 39/34* (2023.02); *H10K 85/311* (2023.02); *H10K 85/322* (2023.02); *H10K 85/371* (2023.02); *H10K 85/624* (2023.02); *H10K 39/32* (2023.02); *H10K 85/211* (2023.02); *H10K 2102/351* (2023.02)

(58) Field of Classification Search

CPC .... H10K 30/20; H10K 85/311; H10K 85/322; H10K 85/371; H10K 85/624; H10K 39/32; H10K 85/211; H10K 2102/351; H10K 30/30; H10K 39/34; H10K 65/00; H10K 85/324; H10K 85/633; H10K 85/6572; Y02E 10/549; H01L 27/14678

See application file for complete search history.

(56) References Cited

U.S. PATENT DOCUMENTS

| | | | |
|---|---|---|---|
| 8,933,438 | B2 | 1/2015 | Leem et al. |
| 9,666,817 | B2 | 5/2017 | Kim et al. |

(Continued)

FOREIGN PATENT DOCUMENTS

| | | |
|---|---|---|
| JP | 2015-535659 A | 12/2015 |
| KR | 10-1387188 | 4/2014 |

(Continued)

*Primary Examiner* — Elias Ullah

(74) *Attorney, Agent, or Firm* — Womble Bond Dickinson (US) LLP

(57) ABSTRACT

An organic photodetector includes: an anode; a cathode facing the anode; and an active layer disposed between the anode and the cathode and including a first layer and a second layer. The first layer is disposed between the anode and the second layer, the first layer includes a p-type organic semiconductor and an n-type organic semiconductor, and the second layer includes the p-type organic semiconductor.

20 Claims, 6 Drawing Sheets

(51) Int. Cl.

| | |
|---|---|
| *H10K 39/32* | (2023.01) |
| *H10K 85/20* | (2023.01) |
| *H10K 102/00* | (2023.01) |

(56) References Cited

U.S. PATENT DOCUMENTS

| | | | | |
|---|---|---|---|---|
| 10,297,775 | B2 | 5/2019 | Lassister et al. | |
| 11,121,336 | B2 | 9/2021 | Forrest et al. | |
| 11,487,373 | B2 | 11/2022 | Kubota et al. | |
| 2005/0110005 | A1* | 5/2005 | Forrest | H10K 10/40<br>257/40 |
| 2015/0194574 | A1* | 7/2015 | Wang | H10H 20/857<br>257/98 |
| 2015/0349283 | A1* | 12/2015 | Forrest | B82Y 10/00<br>257/40 |

FOREIGN PATENT DOCUMENTS

| | | | |
|---|---|---|---|
| KR | 10-2015-0038353 | | 4/2015 |
| KR | 10-2017-0014797 | | 2/2017 |
| KR | 10-2093793 | | 3/2020 |
| KR | 10-2021-0037556 | A | 4/2021 |

* cited by examiner

ORGANIC PHOTODETECTOR AND ELECTRONIC DEVICE HAVING THE SAME

CROSS-REFERENCE TO RELATED APPLICATION

This application claims priority from and the benefit of Korean Patent Application No. 10-2021-0070965, filed on Jun. 1, 2021, which is hereby incorporated by reference for all purposes as if fully set forth herein.

BACKGROUND

Field

Embodiments of the invention relate generally to a photodetector and an electronic apparatus including the photodetector and more specifically, to an organic photodetector and an electronic apparatus including the organic photodetector.

Discussion of the Background

Photoelectric devices convert light and an electrical signal and include a photodiode and a phototransistor. Photoelectric devices can be applied to an image sensor, a solar cell, an organic light-emitting device, and the like.

Generally, silicon has been mainly used to implement photodiodes. In this case, as the size of pixels decreases, an absorption region may decrease such that sensing sensitivity is deteriorated. Accordingly, organic materials for replacing silicon have been researched.

As organic materials have a large extinction coefficient and selectively absorb light in a specific wavelength region according to the molecular structure thereof, organic materials can be used to photodiodes and color filters simultaneously. Thus, the organic materials may facilitate improvements in sensing sensitivity and high integration.

An organic photodetector (OPD) including such an organic material may be applied to, for example, a display apparatus or an image sensor.

The above information disclosed in this Background section is only for understanding of the background of the inventive concepts, and, therefore, it may contain information that does not constitute prior art.

SUMMARY

Organic photodetectors and electronic devices having the organic photodetectors constructed according to the principles of the invention are capable of improving photodetection efficiency.

Additional features of the inventive concepts will be set forth in the description which follows, and in part will be apparent from the description, or may be learned by practice of the inventive concepts.

According to an aspect of the invention, an organic photodetector includes an anode, a cathode facing the anode, and an active layer disposed between the anode and the cathode, the active layer including a first layer and a second layer, wherein the first layer is disposed between the anode and the second layer, the first layer includes a p-type organic semiconductor and an n-type organic semiconductor, and the second layer includes the p-type organic semiconductor.

The n-type organic semiconductor may have a lowest unoccupied molecular orbital (LUMO) energy level lower than that of the p-type organic semiconductor.

A LUMO energy level of the p-type organic semiconductor may be in a range of about −4.0 electron volts (eV) to about −2.9 eV, and a LUMO energy level of the n-type organic semiconductor may be in a range of about −4.5 eV to about −3.5 eV.

The p-type organic semiconductor may include boron subphthalocyanine chloride (SubPc), copper(II) phthalocyanine (CuPc), tetraphenyldibenzoperiflanthene (DBP), or any combination thereof.

The n-type organic semiconductor may include C60 fullerene, C70 fullerene, or any combination thereof.

The first layer may include a mixed layer of the p-type organic semiconductor and the n-type organic semiconductor.

The first layer may include a bilayer including a first donor layer and a first acceptor layer, the first acceptor layer may be disposed between the first donor layer and the second layer, the first donor layer may include the p-type organic semiconductor, and the first acceptor layer may include the n-type organic semiconductor.

The first donor layer and the first acceptor layer may form a PN junction, and the first acceptor layer and the second layer may form a PN junction.

The p-type organic semiconductor included in the first donor layer may be substantially identical to the p-type organic semiconductor included in the second layer.

The p-type organic semiconductor may include SubPc, CuPc, DBP, or any combination thereof.

A thickness of the first donor layer may be in a range of about 10 Angstroms (Å) to about 1,000 Å, a thickness of the first acceptor layer may be in a range of about 10 Å to about 1,000 Å, and a thickness of the second layer may be in a range of about 5 Å to about 200 Å.

The organic photodetector may further include a hole transport region disposed between the anode and the active layer and an electron transport region disposed between the active layer and the cathode, wherein the hole transport region may include a hole injection layer, a hole transport layer, an electron blocking layer, or any combination thereof, and the electron transport region may include a buffer layer, a hole blocking layer, an electron transport layer, an electron injection layer, or a combination thereof.

The hole transport region may include a hole transport layer, and the electron transport region may include a buffer layer, a hole blocking layer, an electron transport layer, or a combination thereof.

The electron transport region may include a buffer layer, and the buffer layer and the active layer may be in direct contact with each other.

The p-type organic semiconductor included in the second layer may have a lowest unoccupied molecular orbital (LUMO) energy level between a LUMO energy level of the n-type organic semiconductor and a LUMO energy level of a material included in the buffer layer.

A dark current density may be $10^{-5}$ milliamperes per square centimeter ($mA/cm^2$) or lower at a reverse bias of −3 volts (V).

An electronic apparatus may include the organic photodetector.

The electronic apparatus may further include a light-emitting device.

The electronic apparatus may further include a thin-film transistor.

According to another aspect of the invention, an electronic apparatus including a substrate including a photodetection region and a light-emitting region, an organic photodetector disposed on the photodetection region, and a light-emitting device disposed on the light-emitting region, wherein the organic photodetector includes a first pixel electrode, a counter electrode facing the first pixel electrode, and a first common layer, an active layer, and a second common layer sequentially disposed between the first pixel electrode and the counter electrode, the active layer includes a first layer and a second layer, the first layer disposed between the first pixel electrode and the second layer, the first layer includes a p-type organic semiconductor and an n-type organic semiconductor, and the second layer includes the p-type organic semiconductor, the light-emitting device includes a second pixel electrode, a counter electrode facing the second pixel electrode, and the first common layer, an emission layer, and the second common layer sequentially arranged between the second pixel electrode and the counter electrode, the first pixel electrode and the active layer overlap the photodetection region, the second pixel electrode and the emission layer overlap the light-emitting region, and the first common layer, the second common layer, and the counter electrode overlap the photodetection region and the light-emitting region as a whole.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
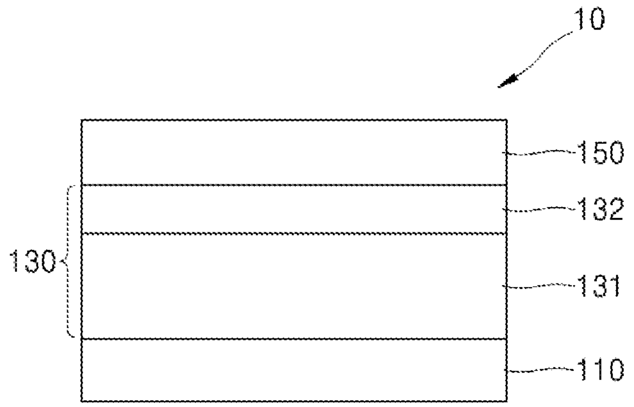
FIG. 1 is a schematic view of an embodiment of an organic photodetector constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic view of an embodiment of an organic photodetector 10.

As shown in FIG. 1, the organic photodetector 10 according to one or more embodiments may include an anode 110, a cathode 150 facing the anode 110, and an active layer 130 between the anode 110 and the cathode 150.

The active layer 130 may be a layer that may generate excitons by receiving light from the outside and separate generated excitons to holes and electrons. The active layer 130 may include a p-type organic semiconductor and an n-type organic semiconductor.

The active layer 130 may include the first layer 131 and the second layer 132. The first layer 131 may be between the anode 110 and the second layer 132.

The first layer 131 may include the p-type organic semiconductor and the n-type organic semiconductor, and the second layer 132 may include the p-type organic semiconductor.

According to one or more embodiments, the second layer 132 may consist of a p-type organic semiconductor.

According to one or more embodiments, the n-type organic semiconductor may have a lowest unoccupied molecular orbital (LUMO) energy level lower than that of the p-type organic semiconductor. For example, in the organic photodetector 10, the second layer 132, which includes the p-type organic semiconductor having a LUMO energy level higher than the n-type organic semiconductor, may be disposed to be adjacent to a surface of the first layer 131 toward the cathode 150. Thus, when electrons generated from the first layer 131 move toward the cathode 150, energy barrier may be reduced or decreased.

According to one or more embodiments, a LUMO energy level of the p-type organic semiconductor may be in a range of about −4.0 electron volts (eV) to about −2.9 eV, and a LUMO energy level of the n-type organic semiconductor may be in a range of about −4.5 eV to about −3.5 eV.

According to one or more embodiments, the first layer 131 and the second layer 132 may be in direct contact with each other.

According to one or more embodiments, the p-type organic semiconductor may be a compound that may operate as an electron donor. The electron donor may supply electrons. According to one or more embodiments, the p-type organic semiconductor may be boron subphthalocyanine chloride (SubPc), copper(II) phthalocyanine (CuPc), tetraphenyldibenzoperiflanthene (DBP), or any combination thereof, but embodiments are not limited thereto.

According to one or more embodiments, the n-type organic semiconductor may be a compound that may operate as an electron acceptor. The electron acceptor may receive electrons. According to one or more embodiments, the n-type organic semiconductor may be C60 fullerene, C70 fullerene, or any combination thereof, but embodiments are not limited thereto.

Figure 2:
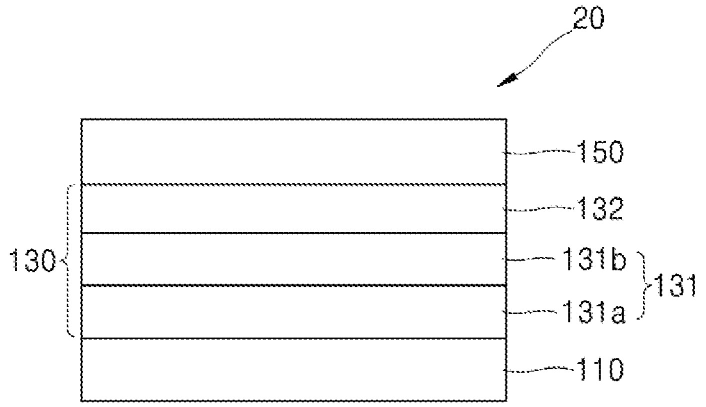
FIG. 2 is a schematic view of another embodiment of the organic photodetector of FIG. 1.

According to one or more embodiments, the first layer 131 may be a mixed layer of the p-type organic semiconductor and the n-type organic semiconductor. In this embodiment, the first layer 131 may be formed by co-depositing the p-type organic semiconductor and the n-type organic semiconductor. When the first layer 131 is a mixed layer, diffusion lengths of electrons and holes, which are separated from the first layer 131 and move toward both electrodes, may be reduced. The diffusion lengths of the electrons and the holes may be measured from a donor-acceptor interface. Thus, the organic photodetector 10 may have an improved external quantum yield. In some embodiments, as shown in FIG. 2, the first layer 131 may be a bilayer including a first donor layer 131*a* and a first acceptor layer 131*b*. The first donor layer 131*a* and the first acceptor layer 131*b* may both be understood by referring to the descriptions of the first donor layer 131*a* and the first acceptor layer 131*b* in FIG. 2.

For example, the thickness of the first layer 131 may be in a range of about 10 Å to about 1,000 Å, for example, about 50 Å to about 500 Å. For example, the thickness of the second layer 132 may be in a range of about 5 Å to about 200 Å, for example, about 10 Å to about 100 Å. A ratio of the thickness of the first layer 131 to the thickness of the second layer 132 may be properly adjusted to thereby improve external quantum efficiency (EQE) characteristics.

FIG. 2 is a schematic view of an embodiment of an organic photodetector 20.

The first layer 131 of the organic photodetector 20 may be a bilayer including the first donor layer 131*a* and the first acceptor layer 131*b*. The first acceptor layer 131*b* may be between the first donor layer 131*a* and the second layer 132.

The first donor layer 131*a* may include the p-type organic semiconductor, and the first acceptor layer 131*b* may include the n-type organic semiconductor. The p-type organic semiconductor included in the first donor layer 131*a* may be identical to or different from the p-type organic semiconductor of the second layer 132.

According to one or more embodiments, the first donor layer 131*a* may consist of a p-type organic semiconductor.

According to one or more embodiments, the first acceptor layer 131*b* may consist of an n-type organic semiconductor.

According to one or more embodiments, the first donor layer 131*a* and the first acceptor layer 131*b* may form a PN junction, and the first acceptor layer 131*b* and the second layer 132 may form a PN junction.

As the p-type organic semiconductor may operate as an electron donor, and the n-type organic semiconductor may operate as an electron acceptor, excitons may be effectively separated to holes and electrons due to photoinduced charge separation in an interface of a donor layer and an acceptor layer or the inside of the donor layer and/or the inside of the acceptor layer. In addition, as the active layer 130 may include a plurality of layers including a p-type semiconductor layer and an n-type semiconductor layer, holes and electrons may be easily trapped or may be easily migrated.

According to one or more embodiments, the p-type organic semiconductor included in the first donor layer 131*a* may be identical to the p-type organic semiconductor of the second layer 132. According to one or more embodiments, the identical p-type organic semiconductor may be SubPc, CuPc, DBP, or any combination thereof, but embodiments are not limited thereto.

According to one or more embodiments, the thickness of the first donor layer 131*a* may be in a range of about 10 Å to about 1,000 Å, for example, about 10 Å to about 500 Å. The thickness of the first acceptor layer 131*b* may be in a range of about 10 Å to about 1,000 Å, for example, about 10 Å to about 500 Å. The thickness of the second layer 132 may be in a range of about 5 Å to about 200 Å, for example, about 10 Å to about 100 Å. A ratio of the thickness of the first donor layer 131*a*, the thickness of the first acceptor layer 131*b*, and the thickness of the second layer 132 may be properly adjusted to thereby improve the external quantum efficiency (EQE) characteristics.

Components other than the first layer 131 in the organic photodetector 20 may be understood by referring to the descriptions of the components in the organic photodetector 10.

According to one or more embodiments, the organic photodetector 10 or 20 may further include a hole transport region between the anode 110 and the active layer 130 and an electron transport region between the active layer 130 and the cathode 150. For example, the hole transport region may include a hole injection layer, a hole transport layer, an electron blocking layer, or any combination thereof. For example, the electron transport region may include a buffer layer, a hole blocking layer, an electron transport layer, an electron injection layer, or a combination thereof.

According to one or more embodiments, in the organic photodetector 10 or 20, the hole transport region may include a hole transport layer, and the electron transport region may include a buffer layer, a hole blocking layer, an electron transport layer, or a combination thereof.

According to one or more embodiments, in the organic photodetector 10 or 20, the electron transport region may include a buffer layer. The buffer layer may be in direct contact with the active layer 130. The buffer layer may be in direct contact with the second layer 132 in the active layer 130.

According to one or more embodiments, the p-type organic semiconductor included in the second layer 132 may have a LUMO energy level between a LUMO energy level of the n-type organic semiconductor and a LUMO energy level of a material included in the buffer layer. For example, in the organic photodetector 10 or 20, the second layer 132, which includes the p-type organic semiconductor having a LUMO energy level between a LUMO energy level of the n-type organic semiconductor and a LUMO energy level included in the buffer layer, may be disposed between the first layer 131 and the buffer layer. Thus, when electrons generated from the first layer 131 move toward the cathode 150, an energy barrier may be reduced. Accordingly, the organic photodetector 10 or 20 may have an improved external quantum efficiency (EQE).

Figure 3A:
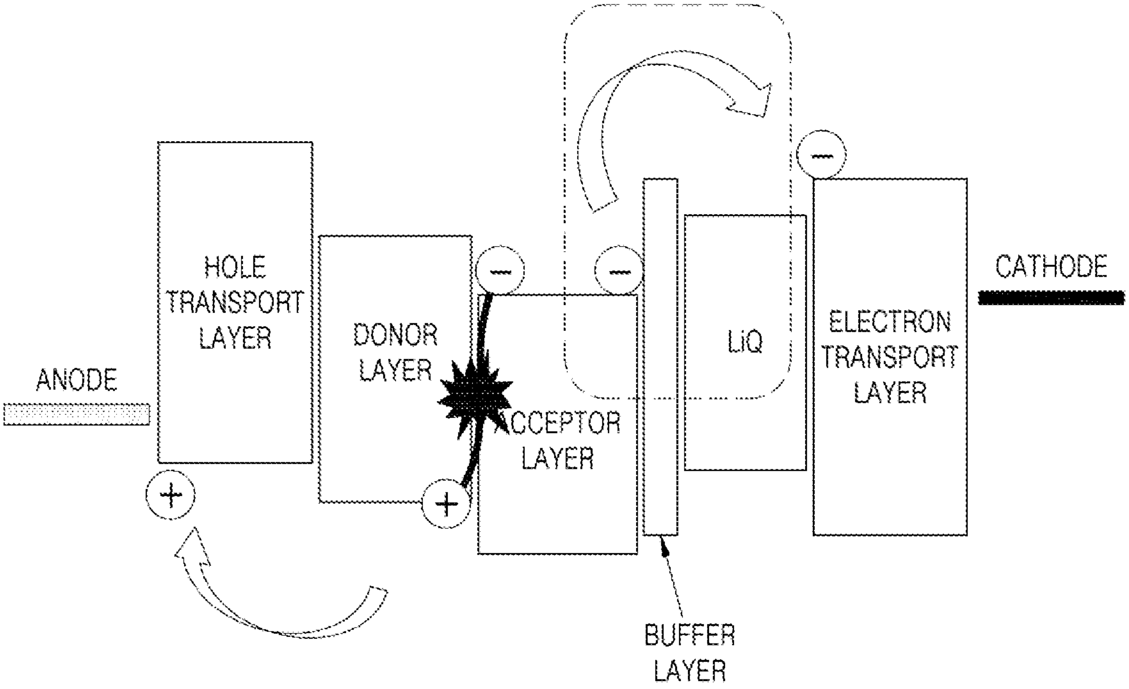
FIG. 3A is an energy diagram of an organic photodetector in a typical art.
Figure 3B:
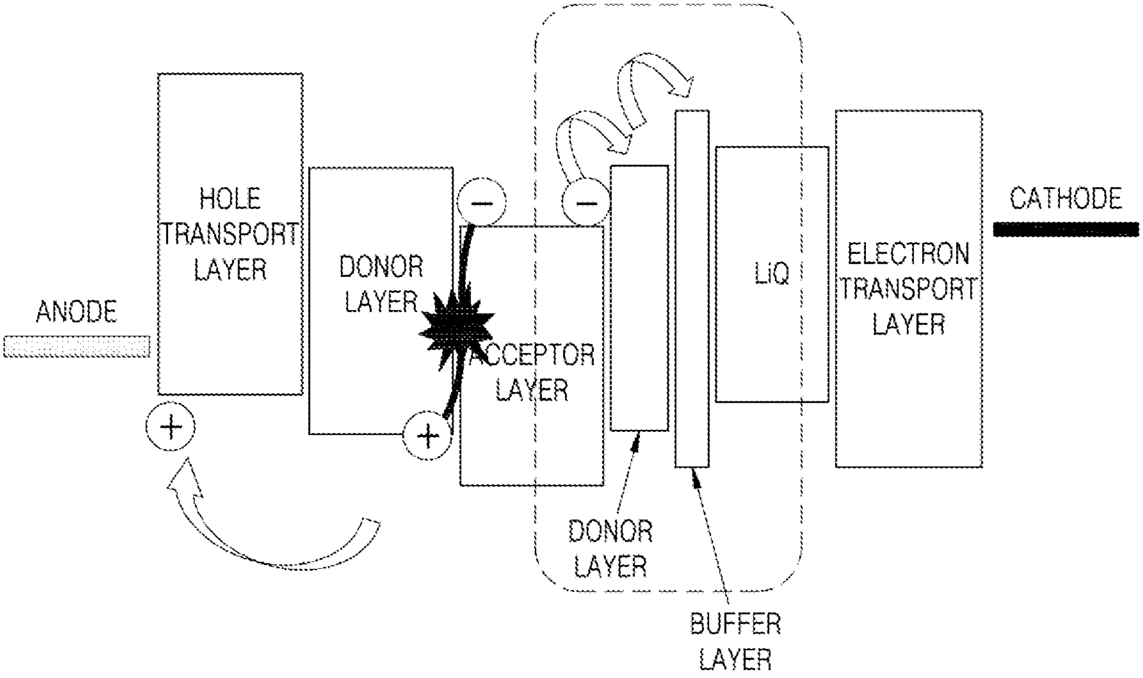
FIG. 3B is an energy diagram of an embodiment of an organic photodetector constructed according to the principles of the invention.

FIG. 3A illustrates an energy diagram of an organic photodetector in a typical art. FIG. 3B illustrates an energy diagram of an organic photodetector according to one or more embodiments.

As shown in FIG. 3A, in the organic photodetector in a typical art, when the buffer layer may be on the active layer, the buffer layer may operate as a high energy barrier in regard to electron migration due to a large difference of the LUMO energy level between the buffer layer and the acceptor layer and due to a high LUMO energy level of a buffer layer material. Accordingly, the external quantum efficiency (EQE) of the organic photodetector may be deteriorated, and thus, it is difficult to use the organic photodetector.

However, in FIG. 3B, the organic photodetector according to one or more embodiments may include a donor layer (e.g., a second layer) between an acceptor layer and a buffer layer, the donor layer including a material having a LUMO energy level between a LUMO energy level of a material of the acceptor layer and a LUMO energy level of a material of the buffer layer. For example, when electrons generated in an interface between a donor layer and an acceptor layer, the inside of the donor layer, and/or the inside of the acceptor layer move toward the cathode, energy barrier may be reduced, and accordingly, the external quantum efficiency (EQE) of the organic photodetector may be improved. In addition, when a donor layer is formed additionally by using a material identical to the material of the donor layer on a side of the anode, the donor layer may be formed without a movement of a deposition chamber.

The LUMO energy levels of examples of the p-type organic semiconductor (e.g., SubPC, CuPC, and DBP) and examples of the n-type organic semiconductor (e.g., C60 and C70, and BCP) were measured in a neat film state by using a photoelectron spectrometer AC-2 (which may be available from RIKEN KEIKI Co., Ltd). The results thereof are shown below in Table 1.

TABLE 1

| | SubPc | CuPc | DBP | C60 | C70 | BCP |
|---|---|---|---|---|---|---|
| LUMO energy level (eV) | −3.4 | −3.3 | −3.5 | −4.1 | −3.9 | −2.9 |

When a reverse bias applied to an organic photodetector is increased, a dark current as well as a response rate may be increased, and thus, noise of the organic photodetector may increase. Accordingly, it may be difficult to secure or obtain a high external quantum efficiency (EQE) and a low dark current by using the organic photodetector in a typical art. However, in the organic photodetector 10 or 20 according to one or more embodiments, by further placing a donor layer on a side of an active layer toward a cathode, a high external quantum efficiency (EQE) and a low dark may be secured or obtained, and thus, the organic photodetector 10 or 20 may have excellent photodetecting characteristics.

According to one or more embodiments, a dark current density of the organic photodetector 10 or 20 may be 1×10-5 milliamperes per square centimeter (mA/cm2) or lower at a reverse bias of −3 volts (V). For example, when applying a reverse bias, reverse injection of charges from an electrode to an active layer may be prevented, and a low dark current and a high photodetection efficiency may be maintained.

The anode 110 will be described below in detail.

In FIGS. 1 and 2, a substrate may be further disposed under the anode 110 or on the cathode 150. The substrate may be a glass substrate or a plastic substrate. The substrate may be a flexible substrate including plastic having excellent heat resistance and durability, for example, polyimide, polyethylene terephthalate (PET), polycarbonate, polyethylene naphthalate, polyarylate (PAR), polyetherimide, or any combination thereof.

The anode 110 may be formed by depositing or sputtering a material for forming the anode 110 on the substrate. A high work function material may be used as a material for forming the anode 110.

The anode 110 may be a reflective electrode, a semi-transmissive electrode, or a transmissive electrode. When the anode 110 is a transmissive electrode, a material for forming the anode 110 may be indium tin oxide (ITO), indium zinc oxide (IZO), tin oxide (SnO2), zinc oxide (ZnO), or any combination thereof. In some embodiments, when the anode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combination thereof may be used as a material for forming the anode 110.

The anode 110 may have a single-layered structure consisting of a single layer or a multi-layered structure including two or more layers. In some embodiments, the anode 110 may have a triple-layered structure of ITO/Ag/ITO.

The charge auxiliary layer will be described below in detail.

The organic photodetector 10 or 20 according to one or more embodiments may include a charge auxiliary layer that may facilitate or perform migration of holes and electrons from the active layer 130.

The charge auxiliary layer may include a hole injection region that may facilitate or perform hole migration and an electron transport region may facilitate or perform electron migration.

The hole transport region will be described below in detail.

The organic photodetector 10 or 20 according to one or more embodiments may further include a hole transport region between the anode 110 and the active layer 130.

The hole transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The hole transport region may include a hole injection layer, a hole transport layer, an electron blocking layer, or any combination thereof.

For example, the hole transport region may include a hole injection layer/hole transport layer structure, a hole injection layer/electron blocking layer structure, a hole transport layer/electron blocking layer structure, or a hole injection layer/hole transport layer/electron blocking layer structure. For example, layers of each structure are sequentially stacked on the anode 110 in each stated order.

The hole transport region may include the compound represented by Formula 201, the compound represented by Formula 202, or any combination thereof:

Formula 201

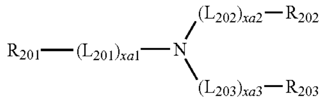

Formula 202

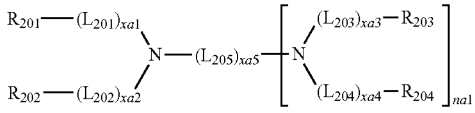

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group (e.g., a carbazole group or the like) unsubstituted or substituted with at least one $R_{10a}$ (e.g., Compound HT16 described herein), $R_{203}$ and $R_{204}$ may optionally be bound to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and
na1 may be an integer from 1 to 4.
In some embodiments, Formulae 201 and 202 may each include at least one of groups represented by Formulae CY201 to CY217:
CY201
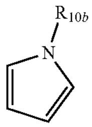
CY202
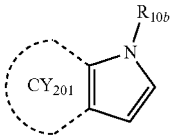
CY203
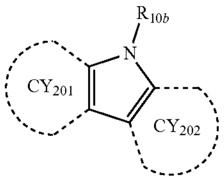
CY204
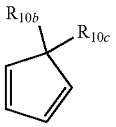
CY205
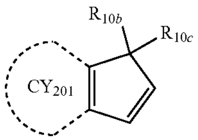
CY206
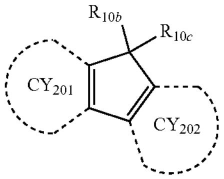
-continued
CY207
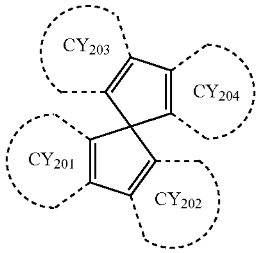
CY208
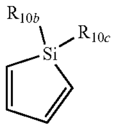
CY209
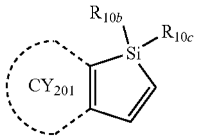
CY210
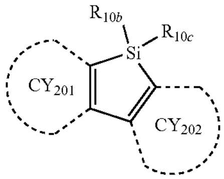
CY211
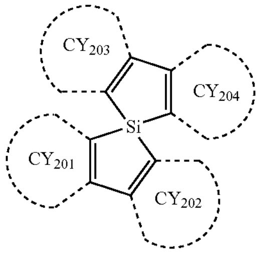
CY212
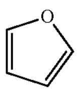
CY213
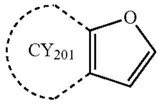

-continued

CY214

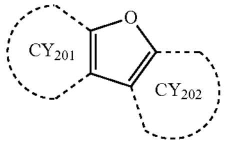

CY215

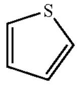

CY216

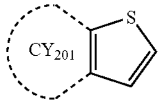

CY217

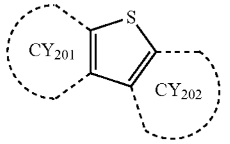

wherein, in Formulae CY201 to CY217, $R_{10b}$ and $R_{10c}$ may each be understood by referring to the descriptions of $R_{10a}$, ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$.

In an embodiment, in Formulae CY201 to CY217, ring $CY_{201}$ to ring $CY_{204}$ may each independently be a benzene group, a naphthalene group, a phenanthrene group, or an anthracene group.

In one or more embodiments, Formulae 201 and 202 may each include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, in Formula 201, xa1 may be 1, $R_{201}$ may be represented by one of Formulae CY201 to CY203, xa2 may be 0, and $R_{202}$ may be represented by one of Formulae CY204 to CY207.

In one or more embodiments, Formulae 201 and 202 may each not include groups represented by Formulae CY201 to CY203.

In one or more embodiments, Formulae 201 and 202 may each not include groups represented by Formulae CY201 to CY203, and include at least one of groups represented by Formulae CY204 to CY217.

In one or more embodiments, Formulae 201 and 202 may each not include groups represented by Formulae CY201 to CY217.

In some embodiments, the hole transport region may include one of Compounds HT1 to HT46 and m-MTDATA, TDATA, 2-TNATA, NPB (NPD), 3-NPB, TPD, spiro-TPD, spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphorsulfonic acid (PANI/CSA), polyaniline/poly(4-styrenesulfonate (PANI/PSS), or any combination thereof:

HT1

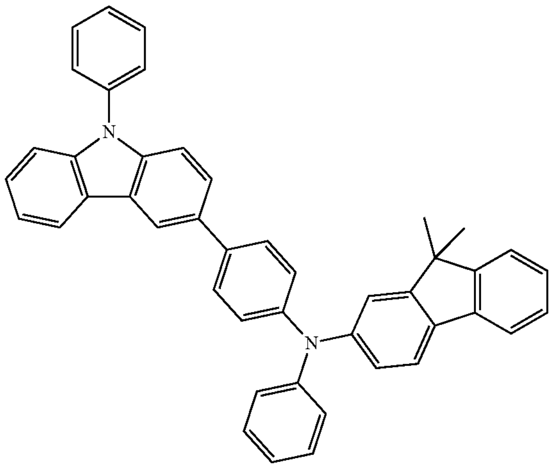

HT2

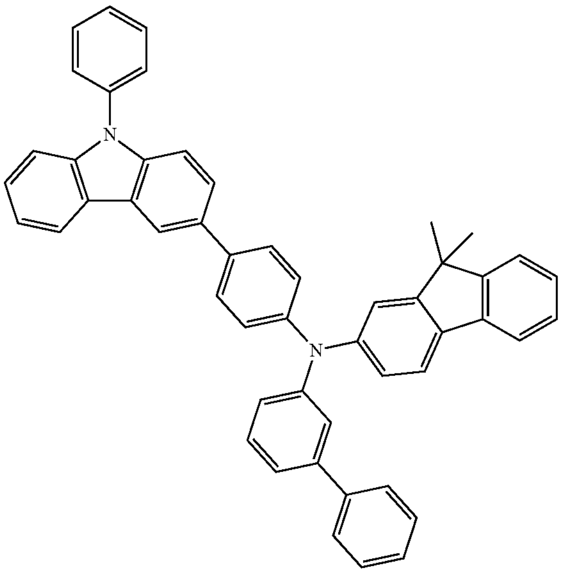

-continued
HT3
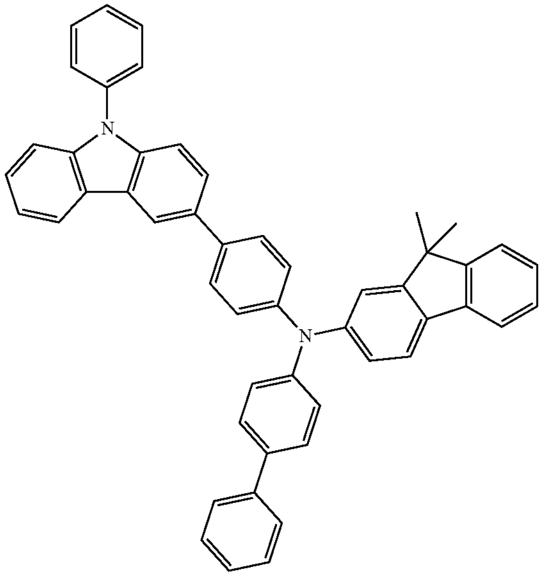
HT4
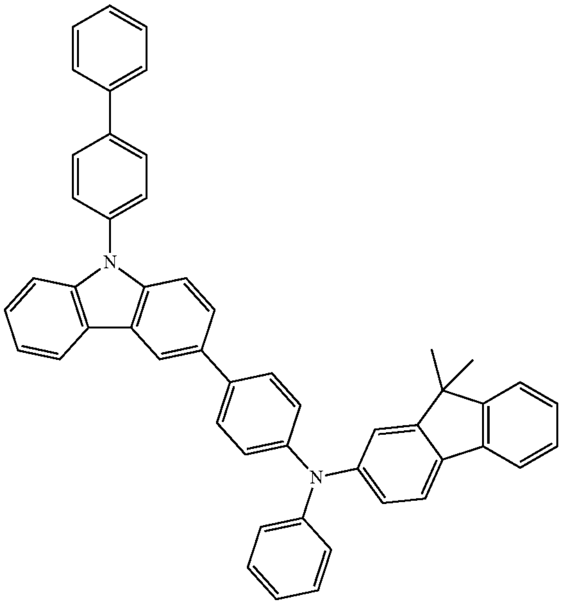
HT5
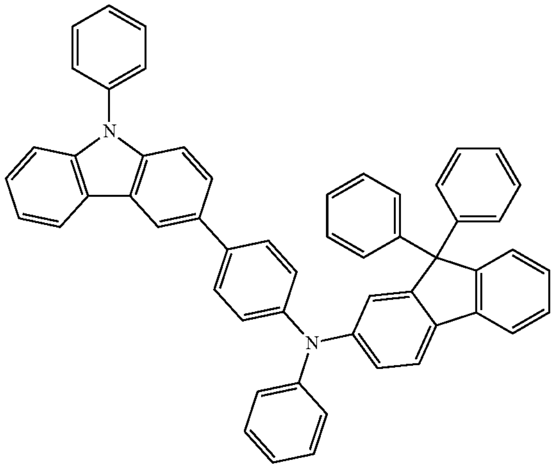
HT6
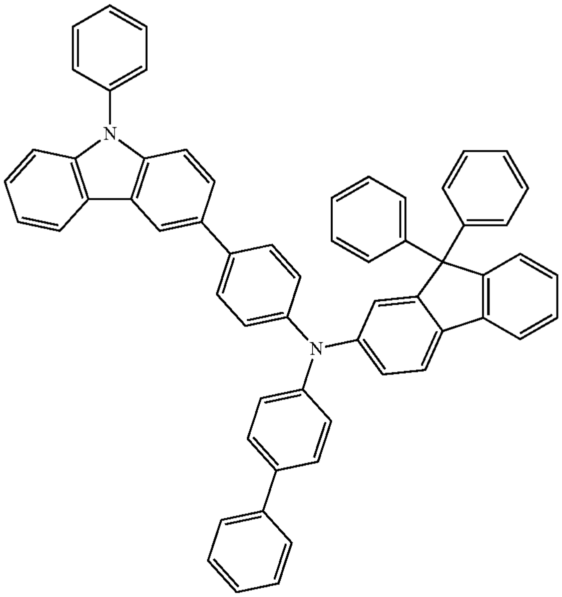

-continued
HT7
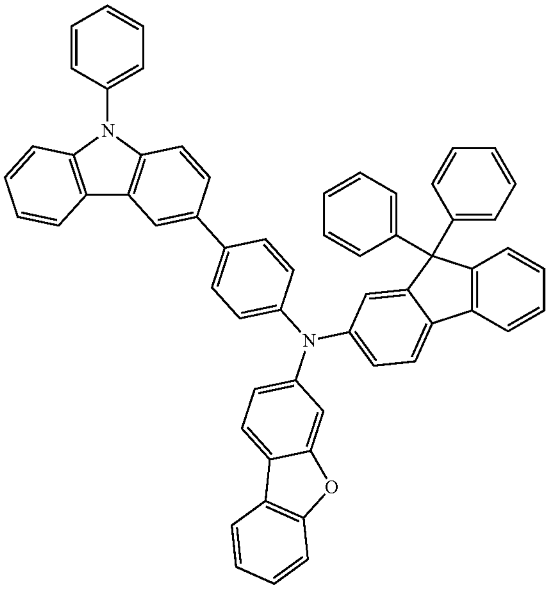
HT8
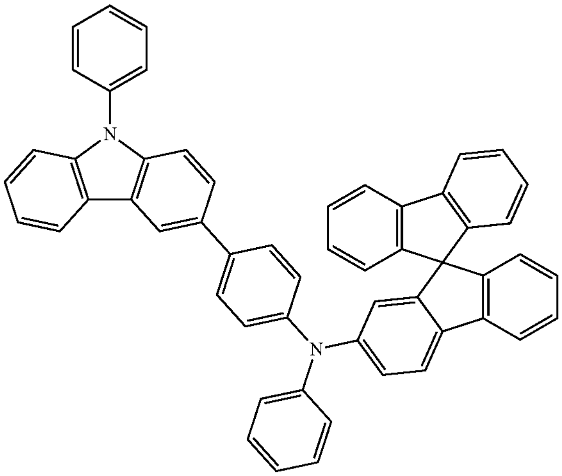
HT9
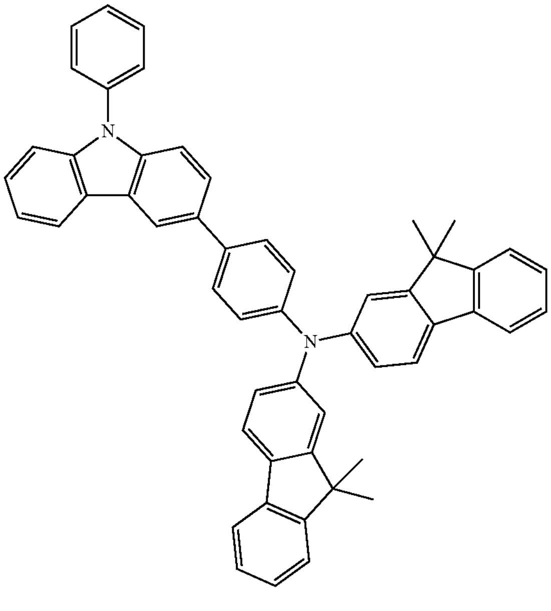
HT10
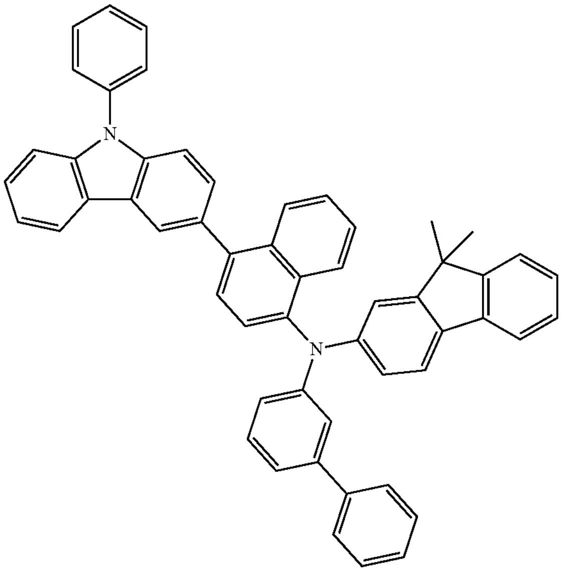

-continued
HT11
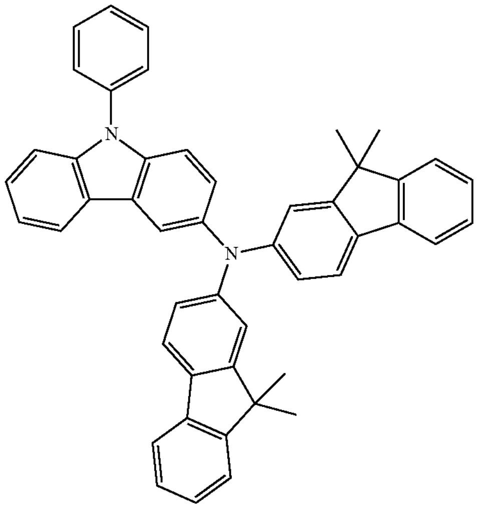
HT12
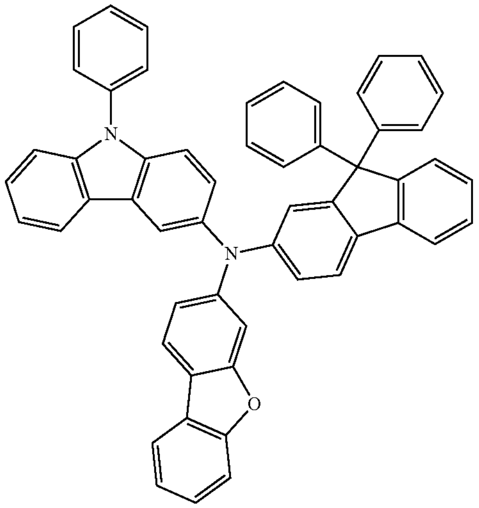
HT13
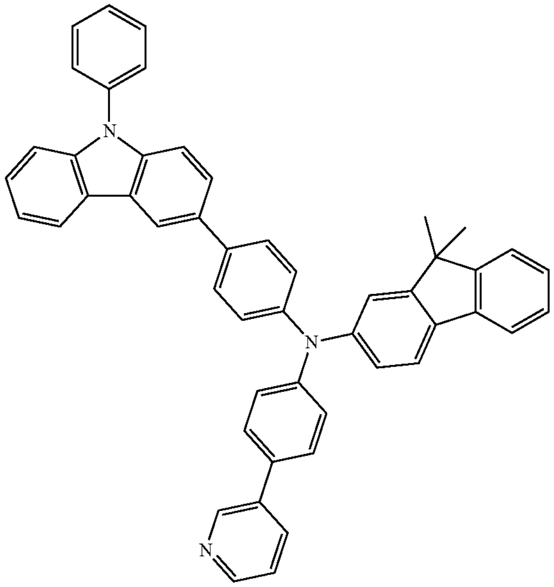
HT14
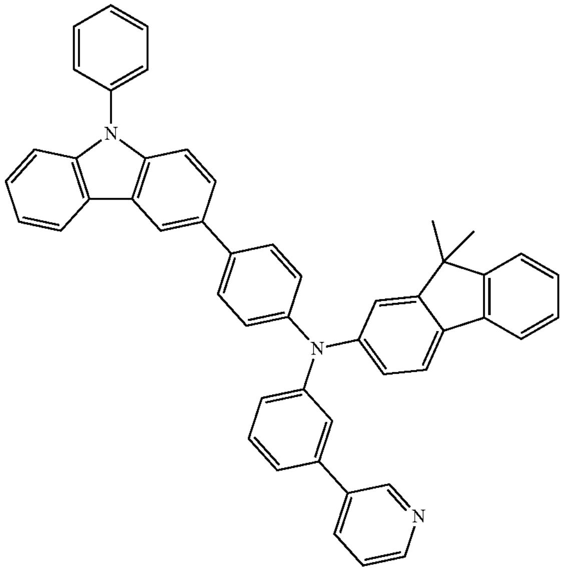
HT15
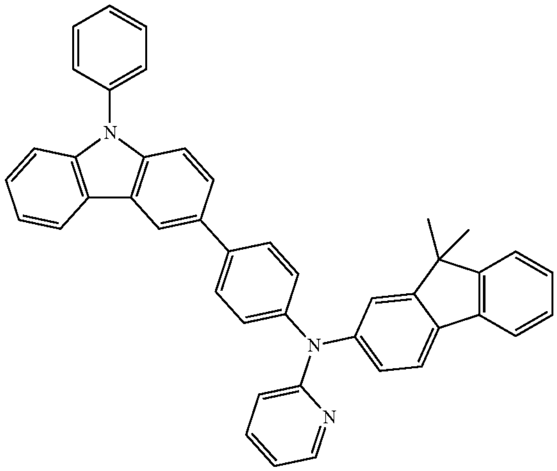
HT16
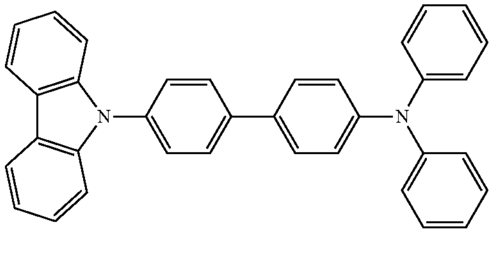

-continued
HT17
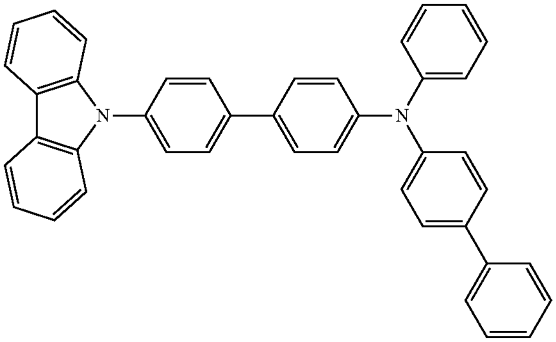
HT18
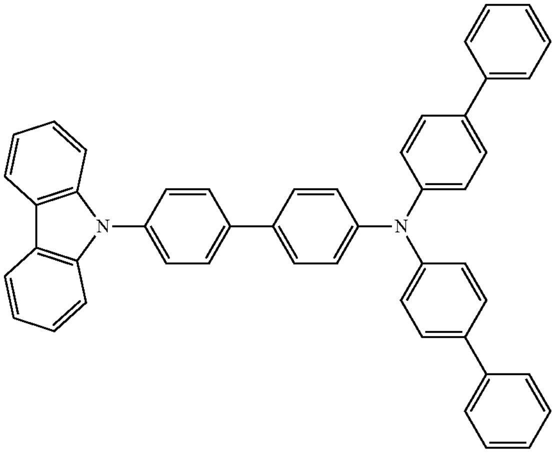
HT19
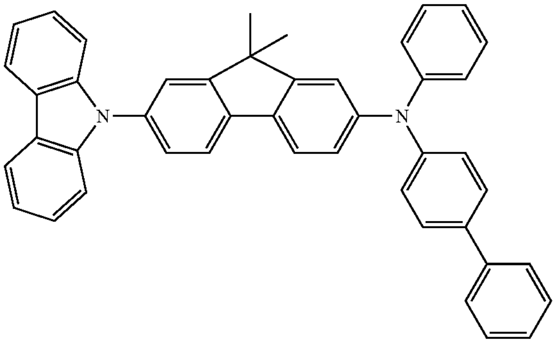
HT20
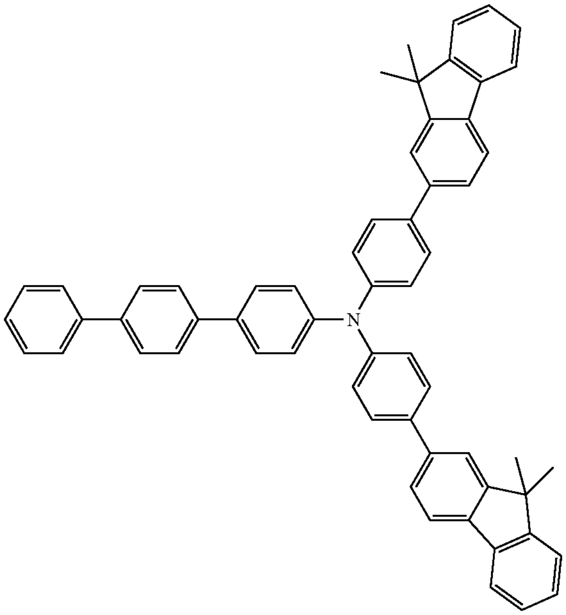

-continued
HT21
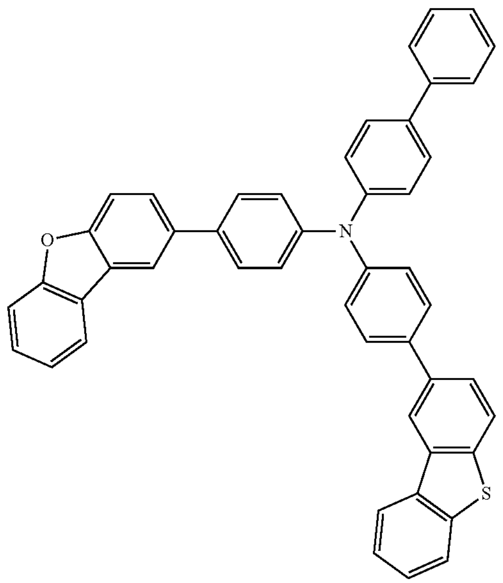
HT22
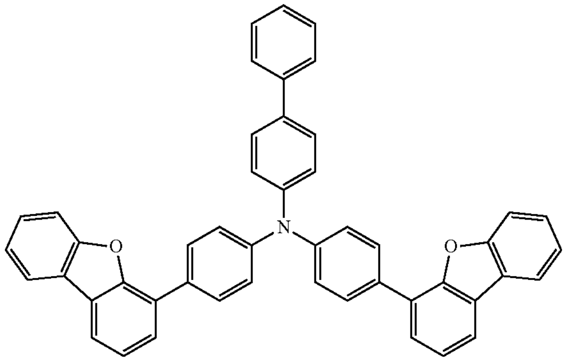
HT23
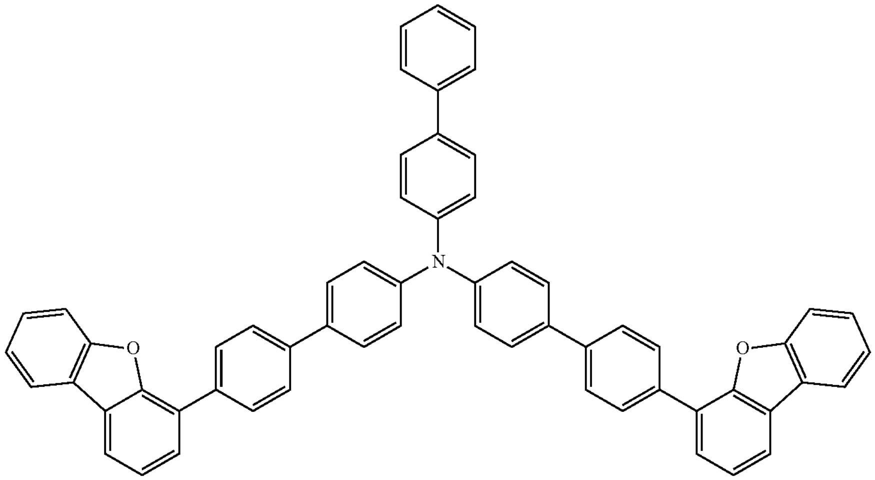
HT24
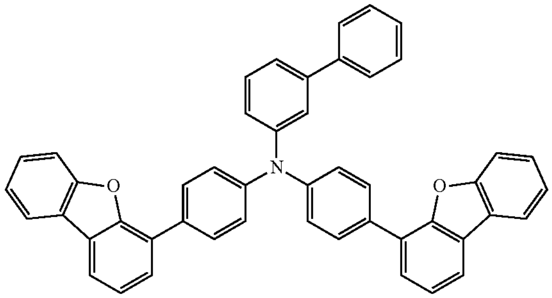
HT25
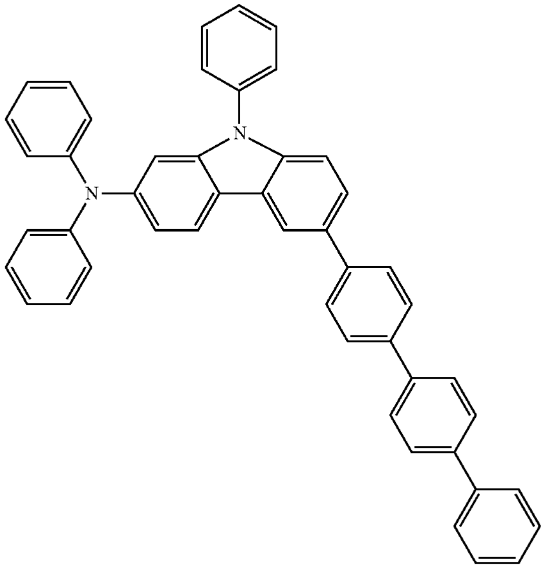

-continued
HT26
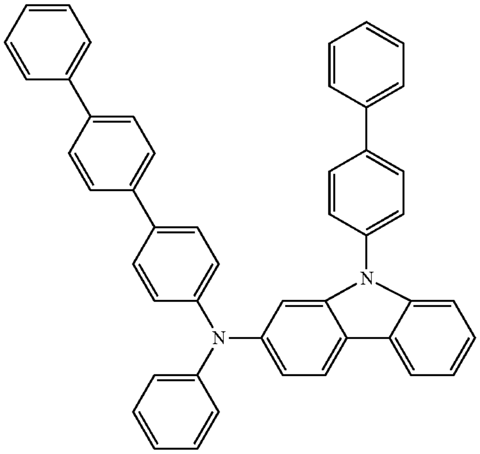
HT27
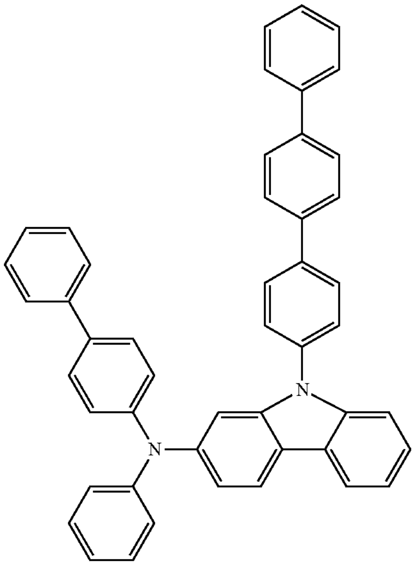
HT28
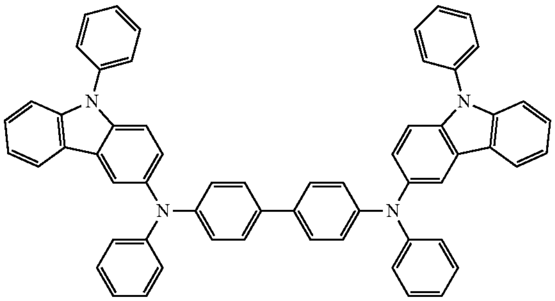
HT29
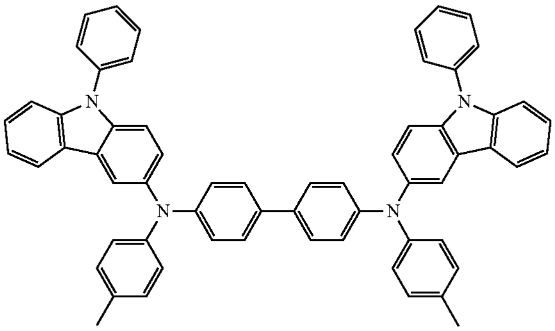
HT30
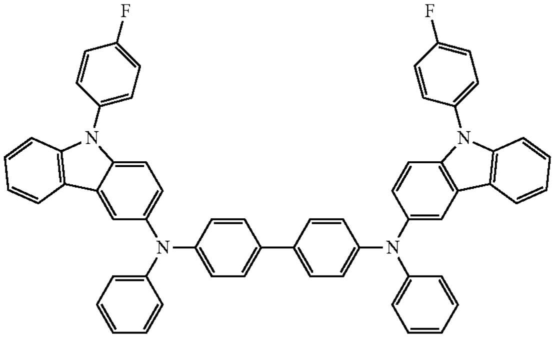
HT31
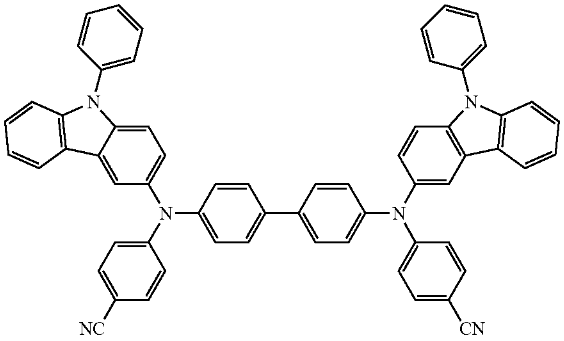

-continued
HT32
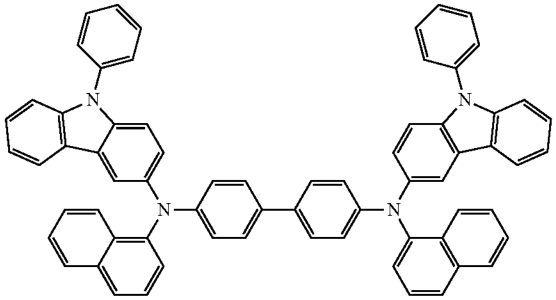
HT33
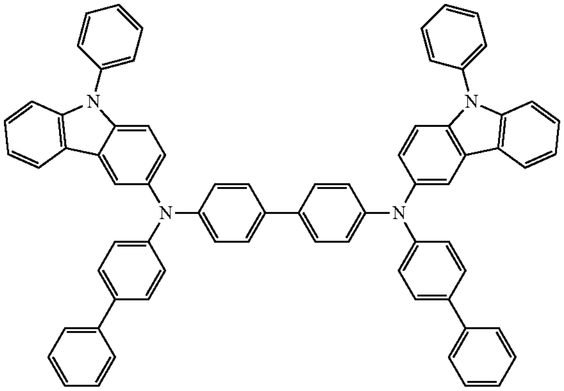
HT34
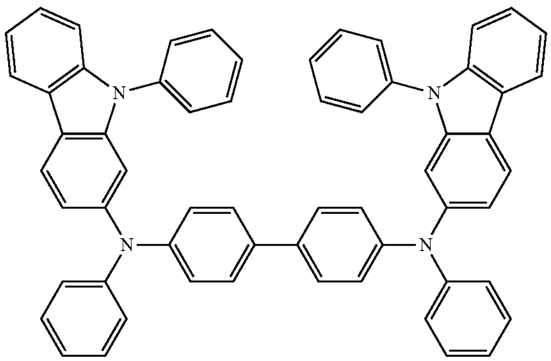
HT35
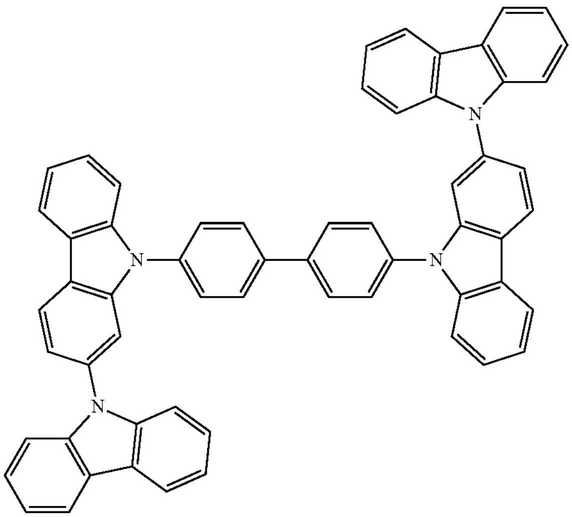
HT36
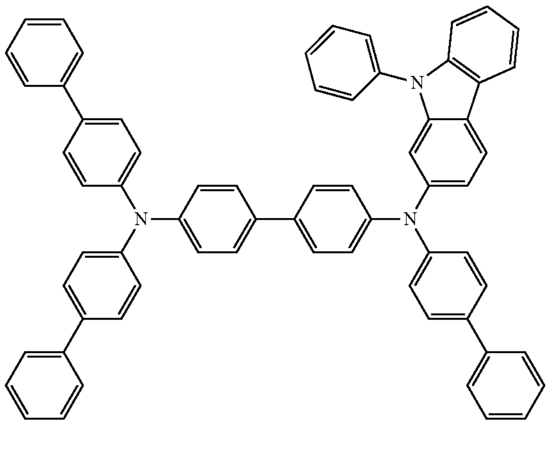
HT37
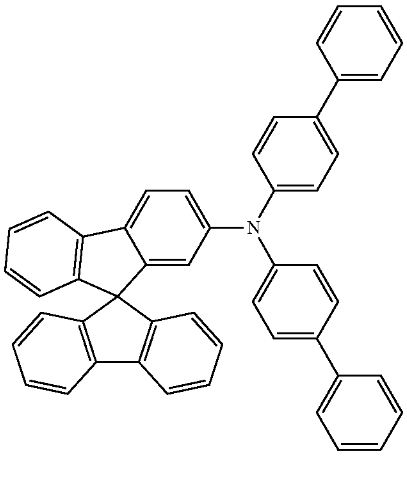

-continued
HT38
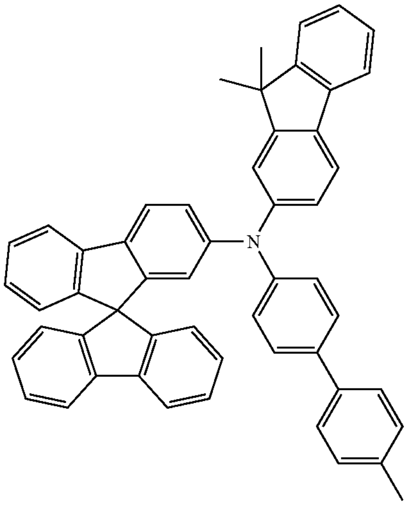
HT39
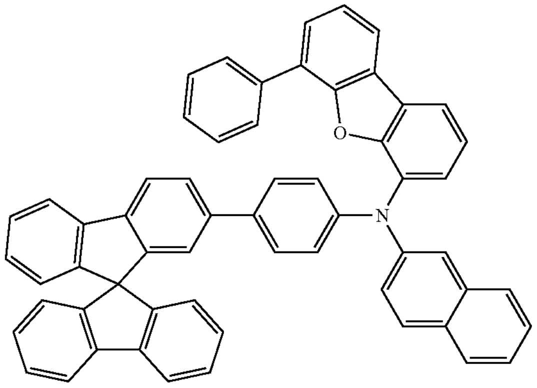
HT40
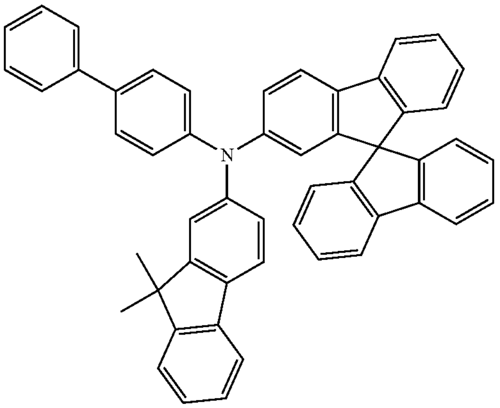
HT41
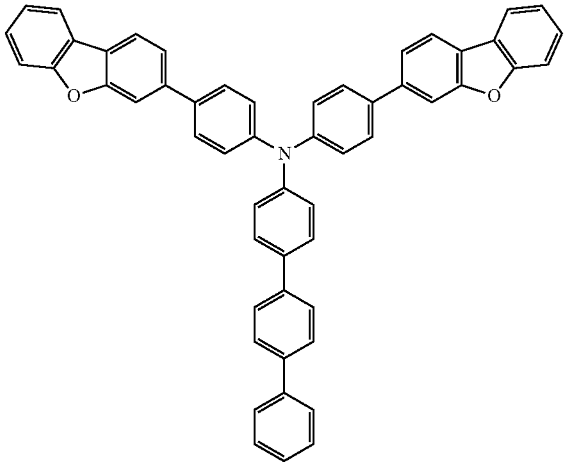
HT42
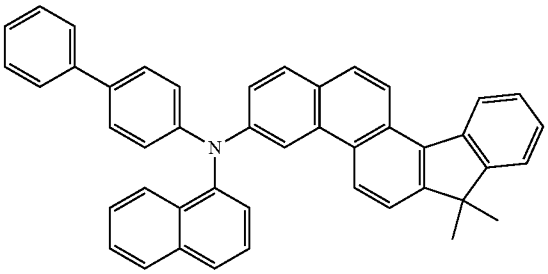
HT43
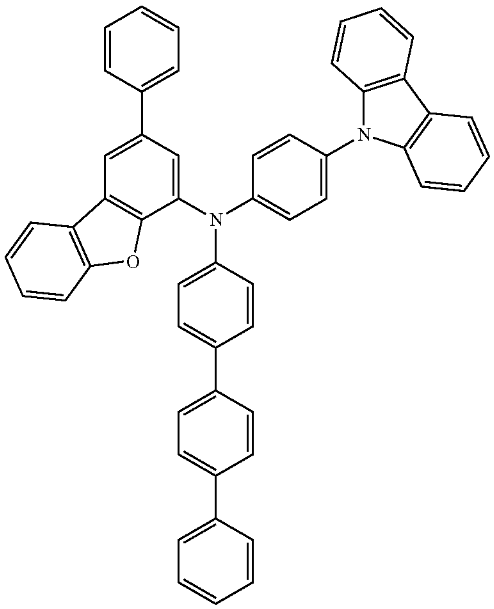

-continued
HT44
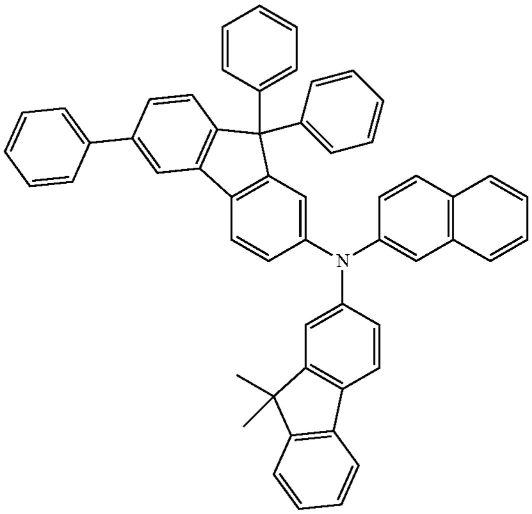
HT45
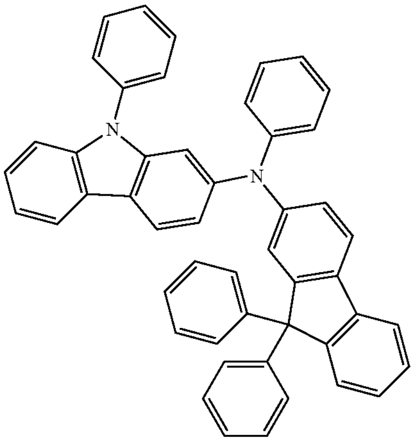
HT46
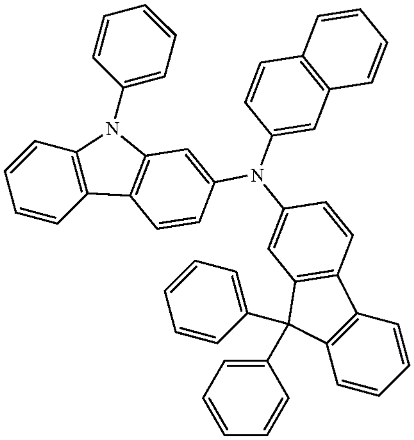
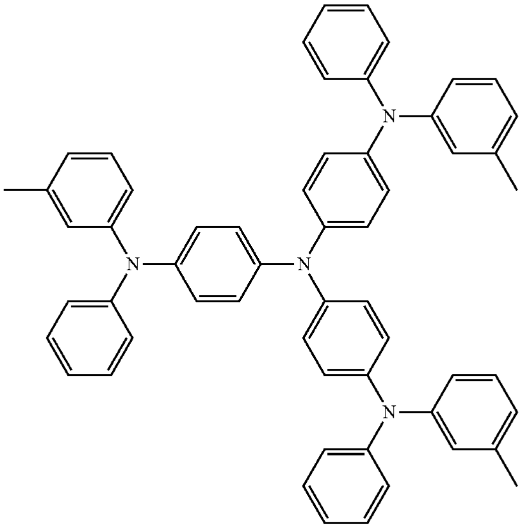
m-MTDATA

-continued
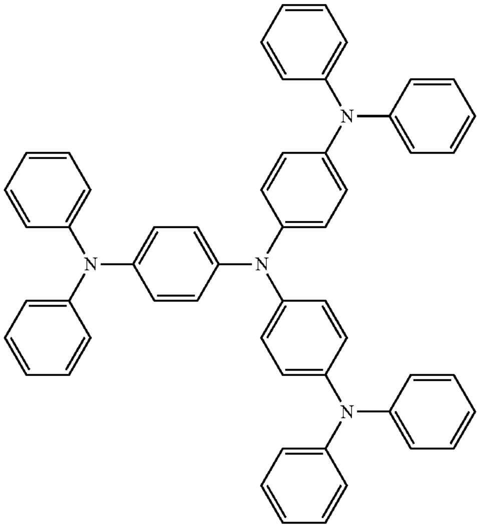
TDATA
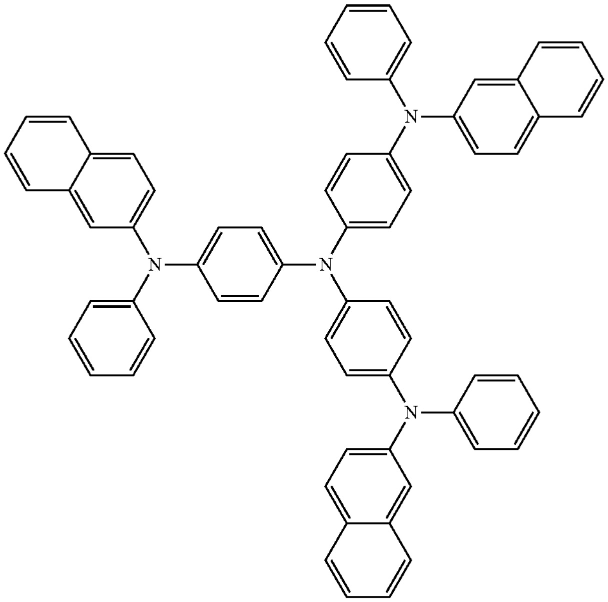
2-TNATA
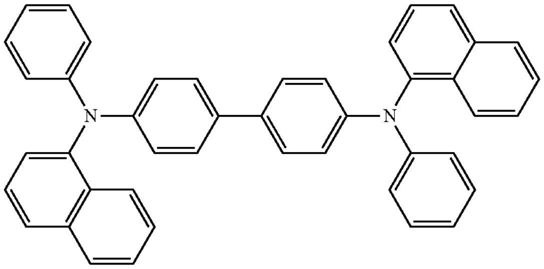
NPB
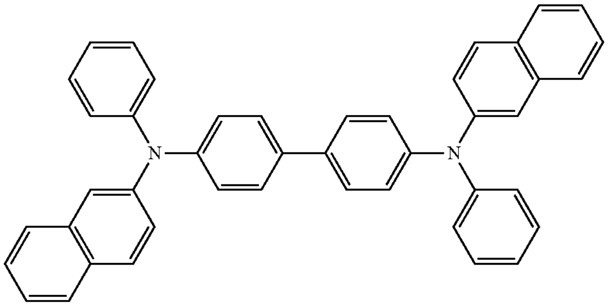
β-NPB
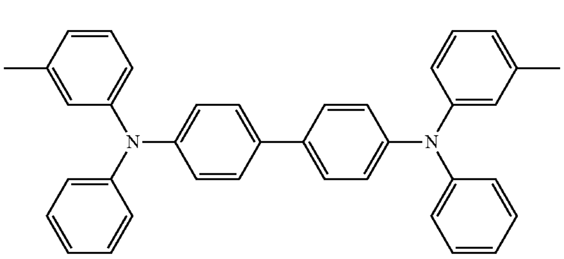
TPD
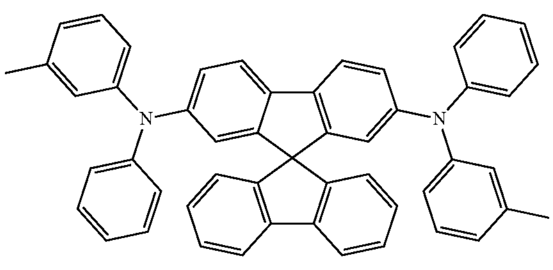
Spiro-TPD -continued

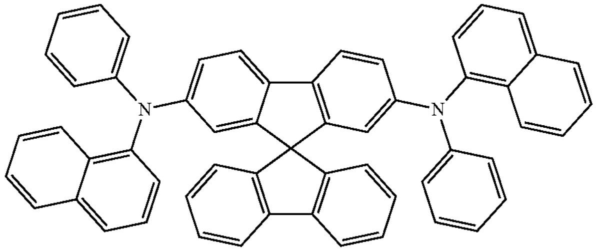

Spiro-NPB

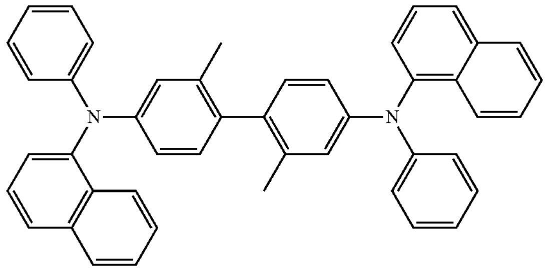

methylated-NPB

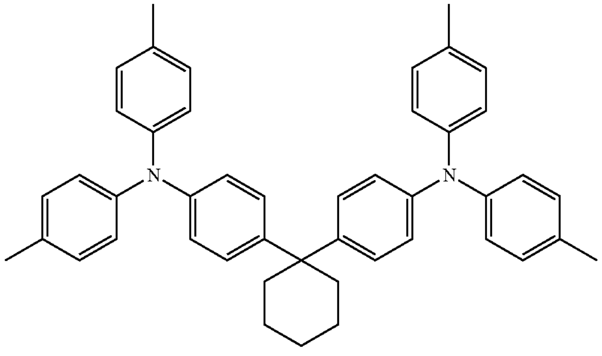

TAPC

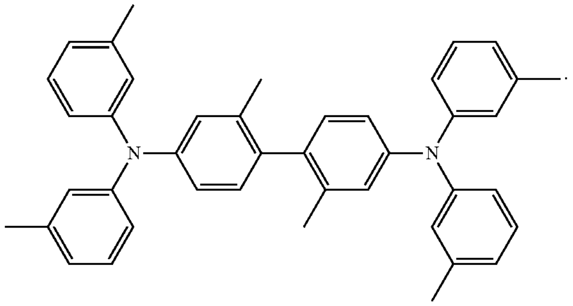

HMTPD

The thickness of the hole transport region may be in a range of about 50 Angstroms (Å) to about 10,000 Å, for example, about 100 Å to about 4,000 Å. When the hole transport region includes a hole injection layer, a hole transport layer, and any combination thereof, the thickness of the hole injection layer may be in a range of about 100 Å to about 9,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The electron blocking layer may be a layer that prevents electron leakage from the active layer 130 to the hole transport region. The aforementioned hole transport material may be included in the electron blocking layer.

The p-dopant will be described below in detail.

The hole transport region may include a charge generating material as well as the aforementioned materials to improve conductive properties of the hole transport region. The charge generating material may be substantially homogeneously or non-homogeneously dispersed (for example, as a single layer consisting of charge generating material) in the hole transport region.

The charge generating material may include, for example, a p-dopant.

In some embodiments, a lowest unoccupied molecular orbital (LUMO) energy level of the p-dopant may be −3.5 eV or less.

In some embodiments, the p-dopant may include a quinone derivative, a compound containing a cyano group, a compound containing element EL1 and element EL2, or any combination thereof.

Examples of the quinone derivative may include TCNQ, F4-TCNQ, and the like.

Examples of the compound containing a cyano group include HAT-CN, a compound represented by Formula 221, and the like:

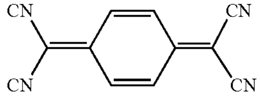

TCNQ

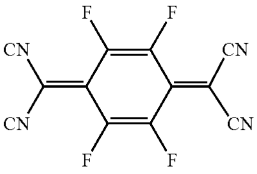

F4-TCNQ

-continued

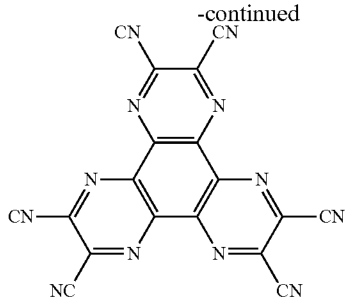

HAT-CN

Formula 221

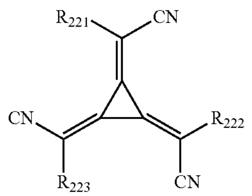

wherein, in Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be: a $C_3$-$C_{60}$ carbocyclic group or a $C_1$-$C_{60}$ heterocyclic group, substituted with a cyano group; —F; —Cl; —Br; —I; a $C_1$-$C_{20}$ alkyl group substituted with a cyano group, —F, —Cl, —Br, —I, or any combination thereof, or any combination thereof.

In the compound containing element EL1 and element EL2, element EL1 may be a metal, a metalloid, or a combination thereof, and element EL2 may be non-metal, a metalloid, or a combination thereof.

Examples of the metal may include: an alkali metal (e.g., lithium (Li), sodium (Na), potassium (K), rubidium (Rb), cesium (Cs), or the like); an alkaline earth metal (e.g., beryllium (Be), magnesium (Mg), calcium (Ca), strontium (Sr), barium (Ba), or the like); a transition metal (e.g., titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); post-transition metal (e.g., zinc (Zn), indium (In), tin (Sn), or the like); a lanthanide metal (e.g., lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like); and the like.

Examples of the metalloid may include silicon (Si), antimony (Sb), tellurium (Te), and the like.

Examples of the non-metal may include oxygen (O), halogen (e.g., F, Cl, Br, I, and the like), and the like.

For example, the compound containing element EL1 and element EL2 may include a metal oxide, a metal halide (e.g., metal fluoride, metal chloride, metal bromide, metal iodide, and the like), a metalloid halide (e.g., a metalloid fluoride, a metalloid chloride, a metalloid bromide, a metalloid iodide, and the like), a metal telluride, or any combination thereof.

Examples of the metal oxide may include a tungsten oxide (e.g., WO, $W_2O_3$, $WO_2$, $WO_3$, or $W_2O_5$), a vanadium oxide (e.g., VO, $V_2O_3$, $VO_2$, or $V_2O_5$), a molybdenum oxide (MoO, $Mo_2O_3$, $MoO_2$, $MoO_3$, or $Mo_2O_5$), and a rhenium oxide (e.g., $ReO_3$).

Examples of the metal halide may include alkali metal halide, alkaline earth metal halide, transition metal halide, post-transition metal halide, lanthanide metal halide, and the like.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, CsI, and the like.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include a titanium halide (e.g., $TiF_4$, $TiCl_4$, $TiBr_4$, or $TiI_4$), a zirconium halide (e.g., $ZrF_4$, $ZrCl_4$, $ZrBr_4$, or $ZrI_4$), a hafnium halide (e.g., $HfF_4$, $HfCl_4$, $HfBr_4$, or $HfI_4$), a vanadium halide (e.g., $VF_3$, $VCl_3$, $VBr_3$, or $VI_3$), a niobium halide (e.g., $NbF_3$, $NbCl_3$, $NbBr_3$, or $NbI_3$), a tantalum halide (e.g., $TaF_3$, $TaCl_3$, $TaBr_3$, or $TaI_3$), a chromium halide (e.g., $CrF_3$, $CrCl_3$, $CrBr_3$, or $CrI_3$), a molybdenum halide (e.g., $MoF_3$, $MoCl_3$, $MoBr_3$, or $MoI_3$), a tungsten halide (e.g., $WF_3$, $WCl_3$, $WBr_3$, or $WI_3$), a manganese halide (e.g., $MnF_2$, $MnCl_2$, $MnBr_2$, or $MnI_2$), a technetium halide (e.g., $TcF_2$, $TcCl_2$, $TcBr_2$, or $TcI_2$), a rhenium halide (e.g., $ReF_2$, $ReCl_2$, $ReBr_2$, or $ReI_2$), an iron halide (e.g., $FeF_2$, $FeCl_2$, $FeBr_2$, or $FeI_2$), a ruthenium halide (e.g., $RuF_2$, $RuCl_2$, $RuBr_2$, or $RuI_2$), an osmium halide (e.g., $OsF_2$, $OsCl_2$, $OsBr_2$, or $OsI_2$), a cobalt halide (e.g., $CoF_2$, $CoCl_2$, $CoBr_2$, or $CoI_2$), a rhodium halide (e.g., $RhF_2$, $RhCl_2$, $RhBr_2$, or $RhI_2$), an iridium halide (e.g., $IrF_2$, $IrCl_2$, $IrBr_2$, or $Ir_{12}$), a nickel halide (e.g., $NiF_2$, $NiCl_2$, $NiBr_2$, or $NiI_2$), a palladium halide (e.g., $PdF_2$, $PdCl_2$, $PdBr_2$, or $PdI_2$), a platinum halide (e.g., $PtF_2$, $PtCl_2$, $PtBr_2$, or $PtI_2$), a copper halide (e.g., CuF, CuCl, CuBr, or CuI), a silver halide (e.g., AgF, AgCl, AgBr, or AgI), and a gold halide (e.g., AuF, AuCl, AuBr, or AuI).

Examples of the post-transition metal halide may include a zinc halide (e.g., $ZnF_2$, $ZnCl_2$, $ZnBr_2$, or $ZnI_2$), an indium halide (e.g., $InI_3$), and a tin halide (e.g., $SnI_2$).

Examples of the lanthanide metal halide may include YbF, $YbF_2$, $YbF_3$, $SmF_3$, YbCl, $YbCl_2$, $YbCl_3SmCl_3$, YbBr, $YbBr_2$, $YbBr_3SmBr_3$, YbI, $YbI_2$, $YbI_3$, and $SmI_3$.

Examples of the metalloid halide may include an antimony halide (e.g., $SbCl_5$).

Examples of the metal telluride may include an alkali metal telluride (e.g., $Li_2Te$, $Na_2Te$, $K_2Te$, $Rb_2Te$, or $Cs_2Te$), an alkaline earth metal telluride (e.g., BeTe, MgTe, CaTe, SrTe, or BaTe), a transition metal telluride (e.g., $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), a post-transition metal telluride (e.g., ZnTe), and a lanthanide metal telluride (e.g., LaTe, CeTe, PrTe, NdTe, PmTe, EuTe, GdTe, TbTe, DyTe, HoTe, ErTe, TmTe, YbTe, or LuTe).

The electron transport region will be described below in detail.

The charge auxiliary layer between the active layer 130 and the cathode 150 may be referred to as an electron transport region.

The electron transport region may have i) a single-layered structure consisting of a single layer consisting of a single material, ii) a single-layered structure consisting of a single layer including a plurality of different materials, or iii) a multi-layered structure having a plurality of layers including a plurality of different materials.

The electron transport region may include a buffer layer, a hole blocking layer, an electron transport layer, an electron injection layer, or a combination thereof.

In some embodiments, the electron transport region may have an electron transport layer/electron injection layer structure, a hole blocking layer/electron transport layer/electron injection layer structure, or a buffer layer/electron transport layer/electron injection layer structure. For example, layers of each structure are sequentially stacked on the active layer 130 in each stated order.

The electron transport region (e.g., a buffer layer, a hole blocking layer, or an electron transport layer in the electron transport region) may include a metal-free compound including at least one π electron-deficient nitrogen-containing $C_1$-$C_{60}$ cyclic group.

In some embodiments, the electron transport region may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —$Si(Q_{601})(Q_{602})(Q_{603})$, —$C(=O)(Q_{601})$, —$S(=O)_2(Q_{601})$, or —$P(=O)(Q_{601})(Q_{602})$, wherein $Q_{601}$ to $Q_{603}$ may each be understood by referring to the description of $Q_1$ provided herein, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, in Formula 601, when xe11 is 2 or greater, at least two $Ar_{601}$(s) may be bound to each other via a single bond.

In some embodiments, in Formula 601, $Ar_{601}$ may be a substituted or unsubstituted anthracene group.

In some embodiments, the electron transport region may include a compound represented by Formula 601-1:

Formula 601-1

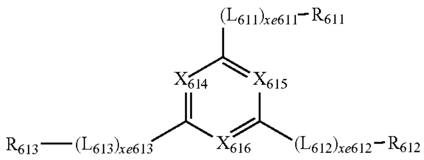

wherein, in Formula 601-1, $X_{614}$ may be N or $C(R_{614})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may each be understood by referring to the description of $L_{601}$ provided herein, xe611 to xe613 may each be understood by referring to the description of xe1 provided herein, $R_{611}$ to $R_{613}$ may each be understood by referring to the description of $R_{601}$ provided herein, and $R_{614}$ to $R_{16}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

For example, in Formulae 601 and 601-1, xe1 and xe611 to xe613 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

ET1

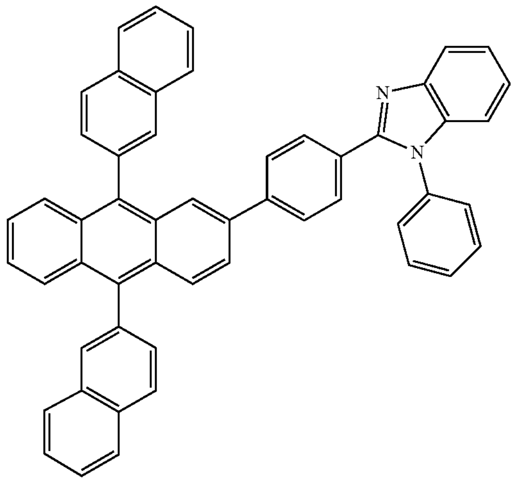

ET2

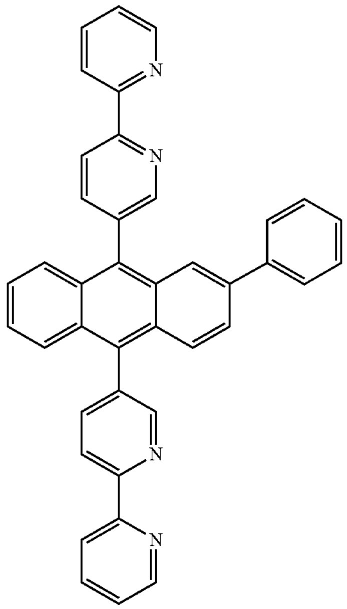

-continued
ET3
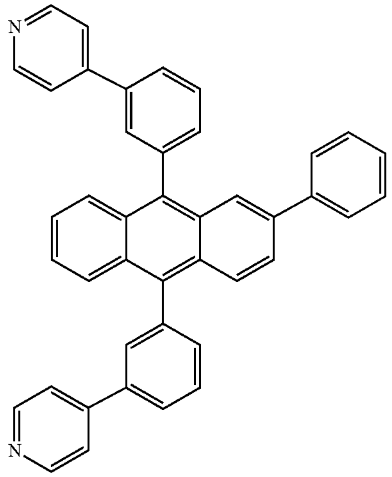
ET4
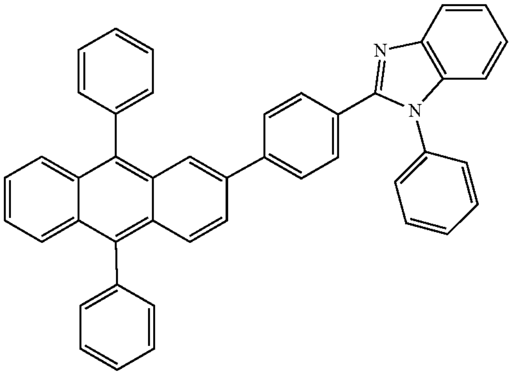
ET5
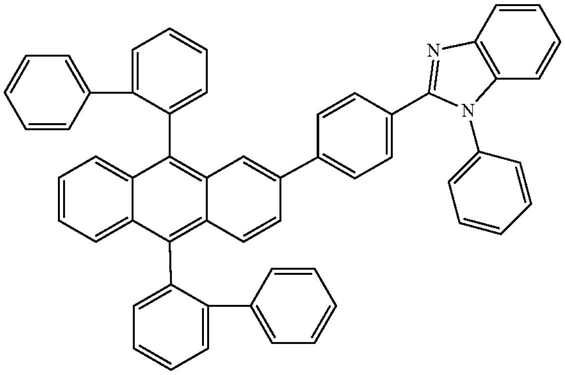
-continued
ET6
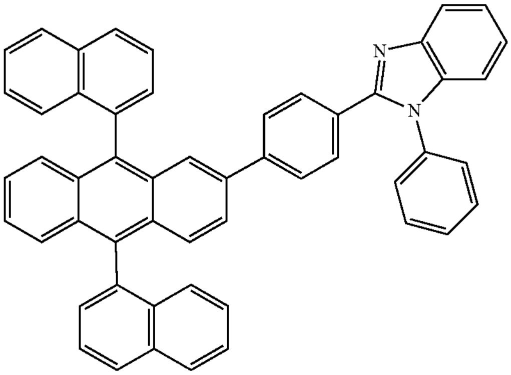
ET7
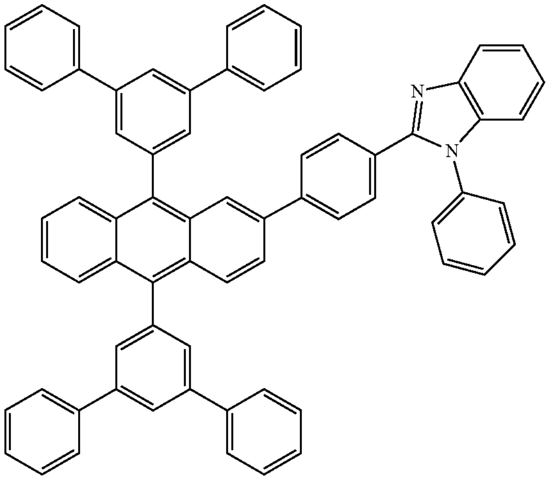
ET8
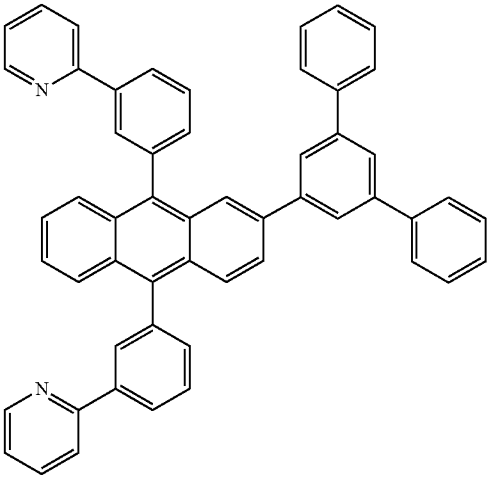

-continued
ET9
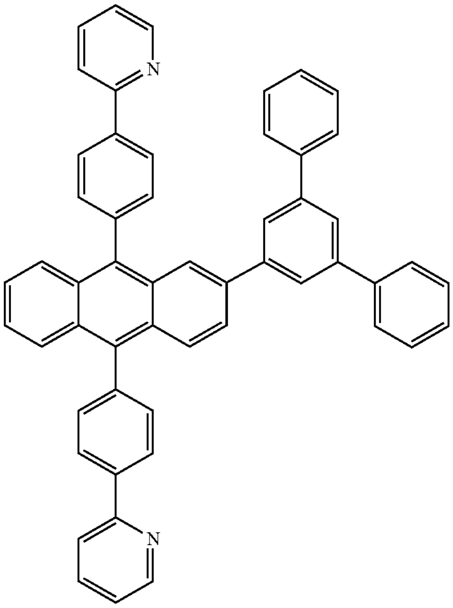
ET10
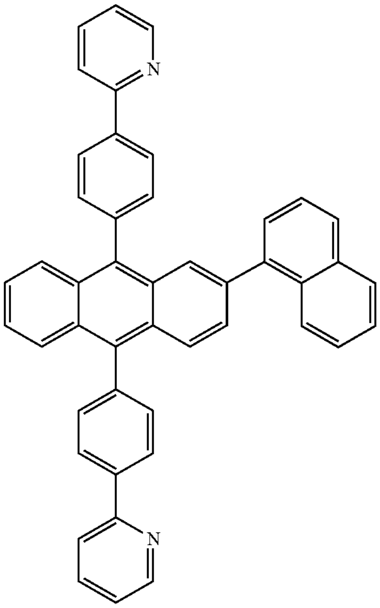
-continued
ET11
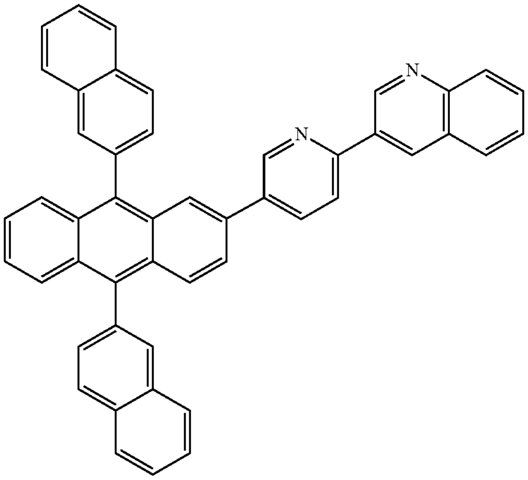
ET12
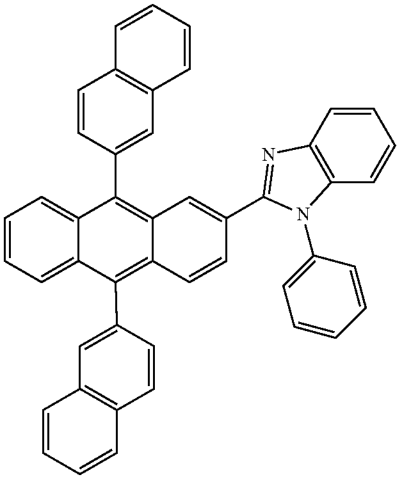
ET13
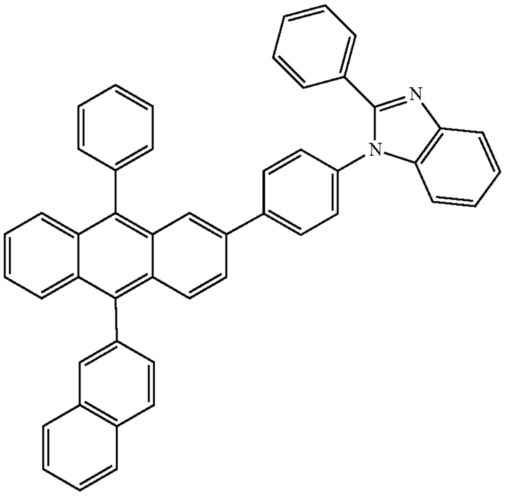

-continued
ET14
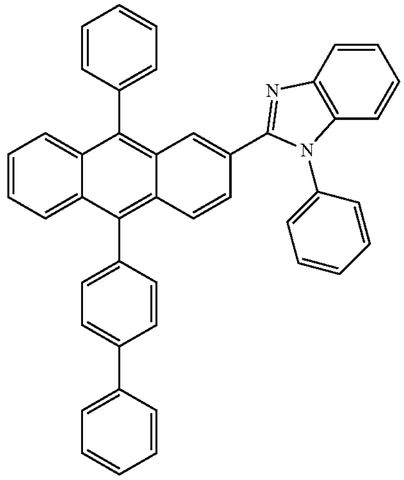
ET15
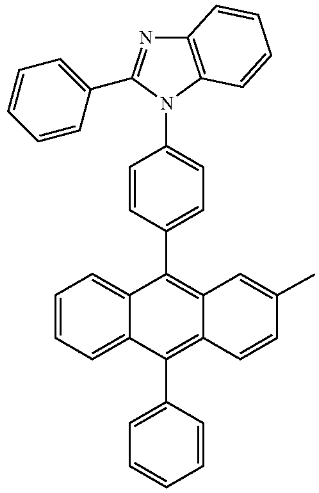
ET16
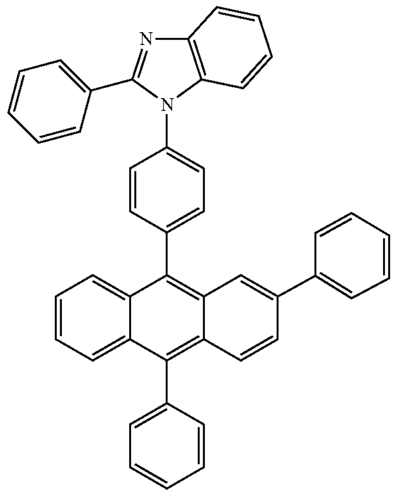
-continued
ET17
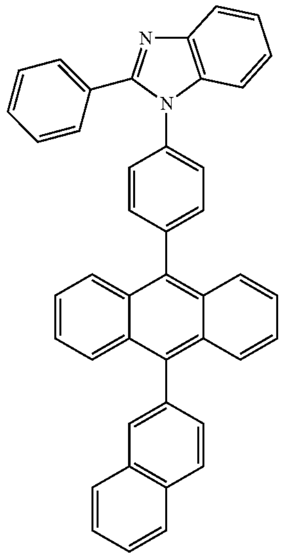
ET18
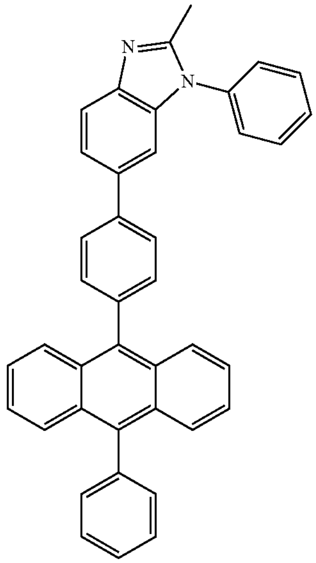
ET19
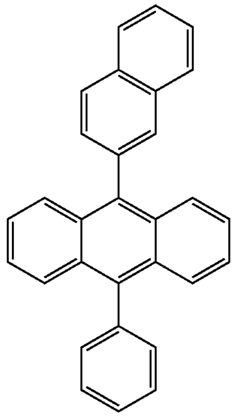

-continued
ET20
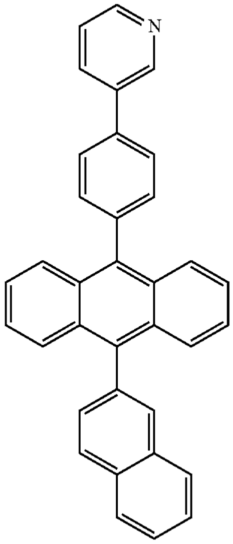
ET21
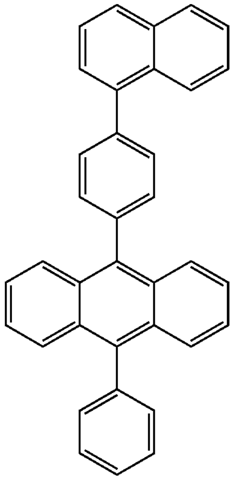
ET22
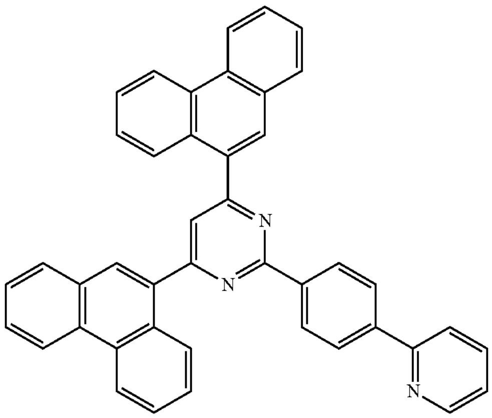
-continued
ET23
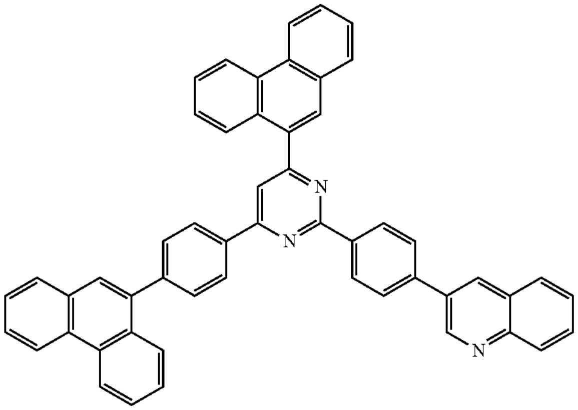
ET24
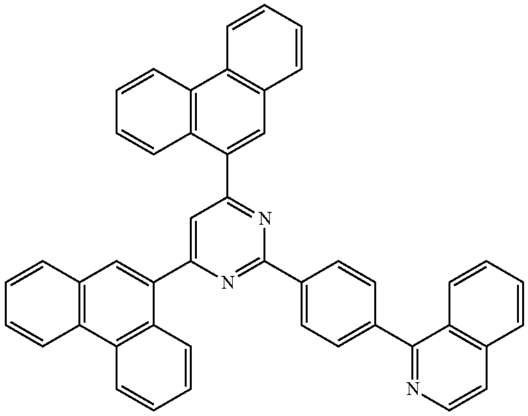
ET25
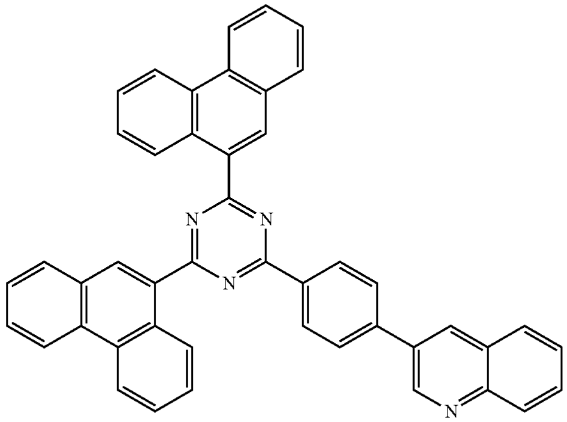

-continued
ET26
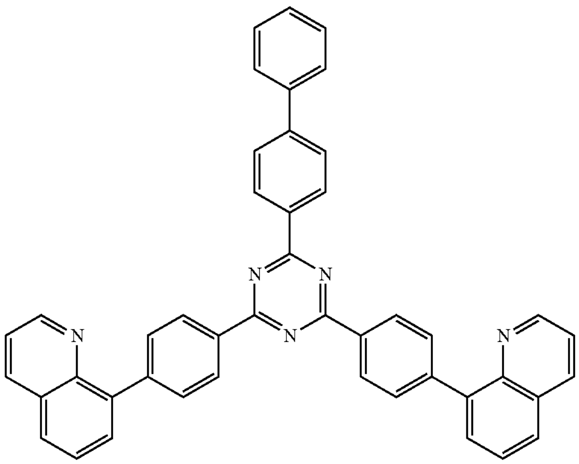
ET27
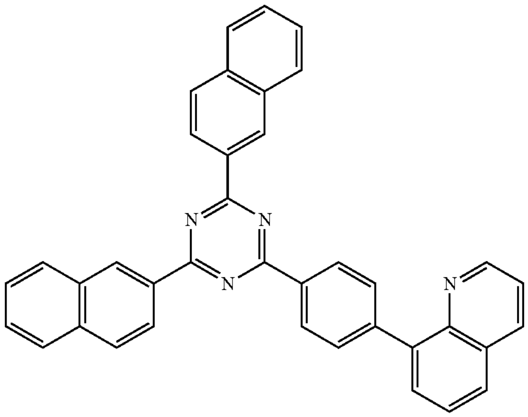
ET28
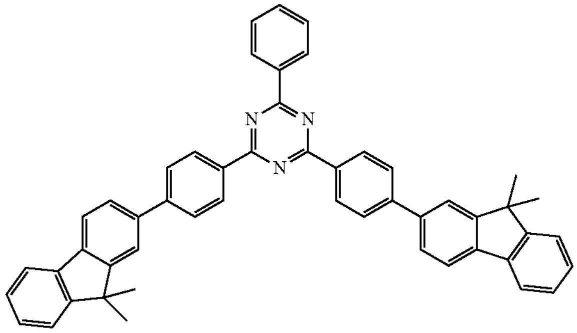
-continued
ET29
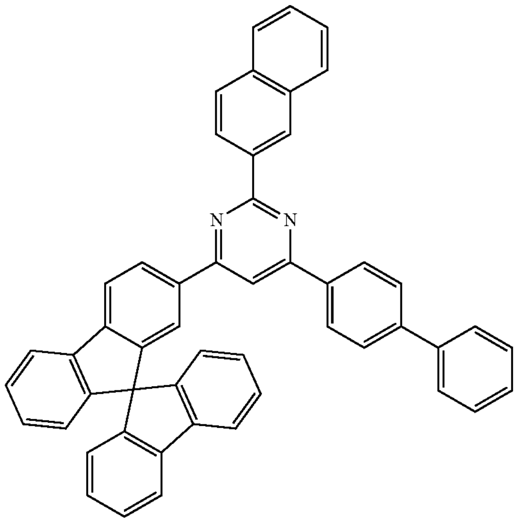
ET30
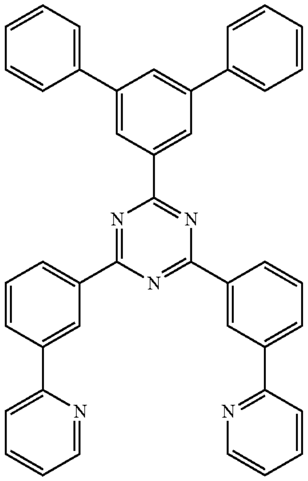
ET31
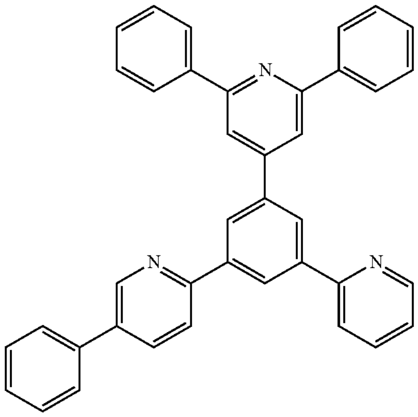

-continued
ET32
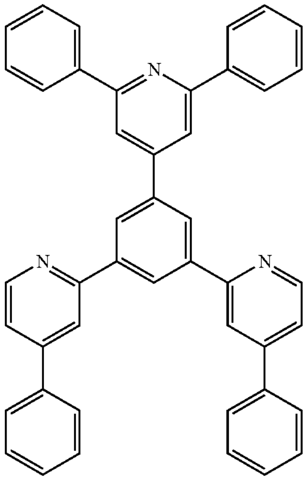
ET33
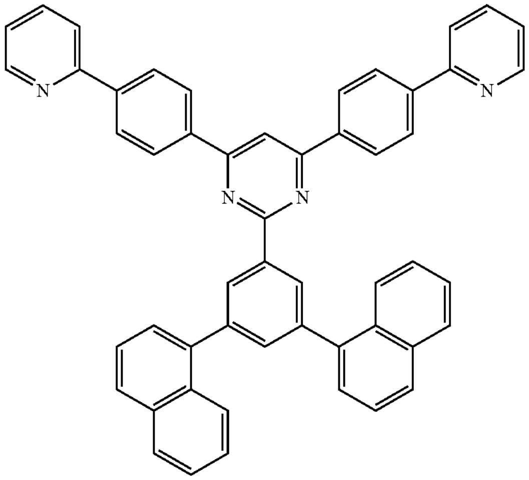
ET34
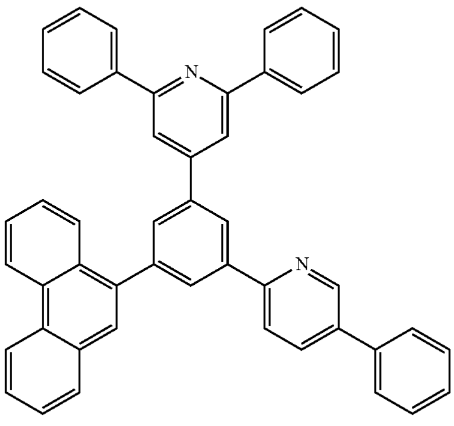
-continued
ET35
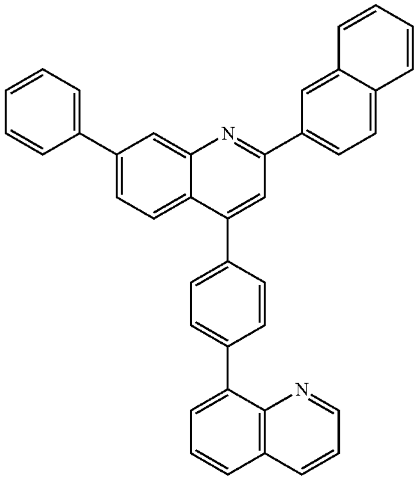
ET36
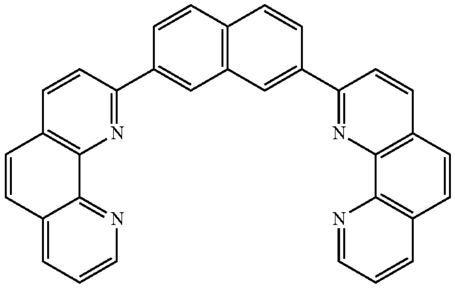
ET37
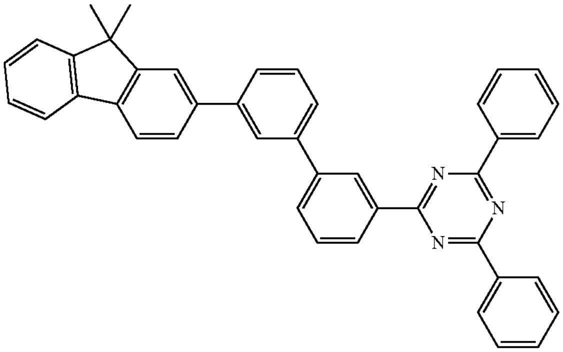
ET38
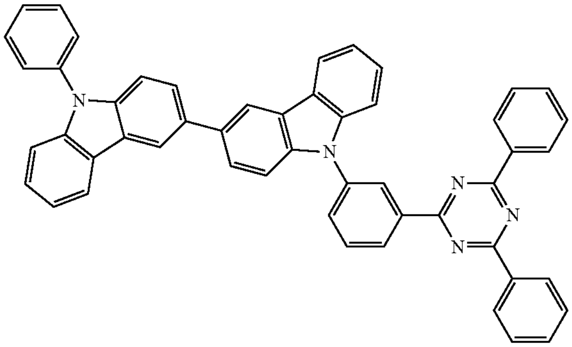

-continued
ET39
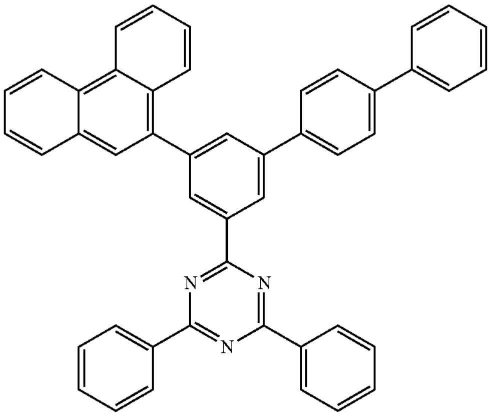
ET40
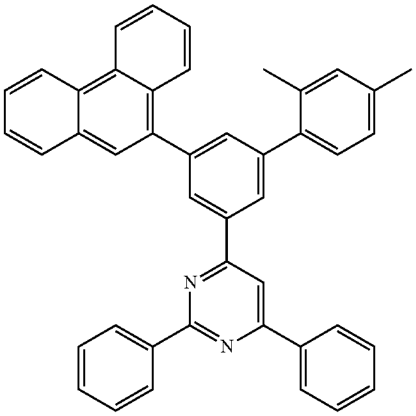
ET41
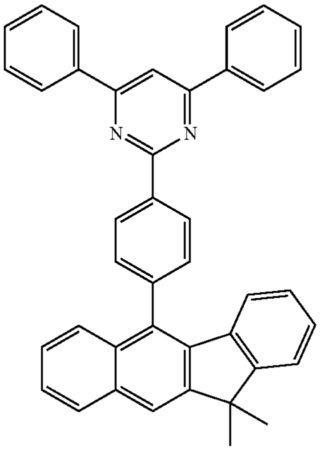
-continued
ET42
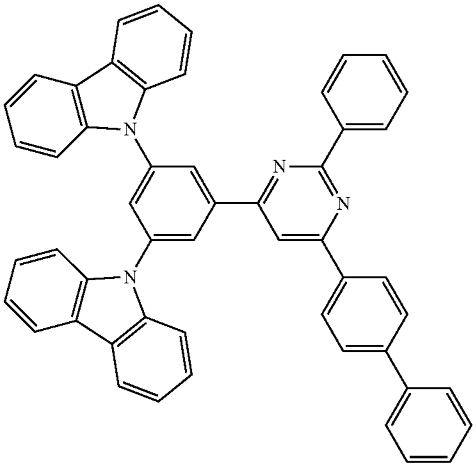
ET43
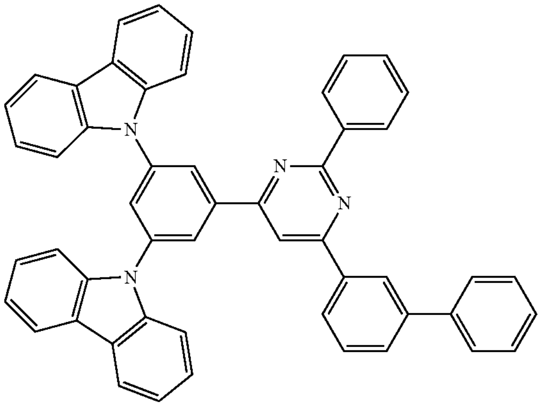
ET44
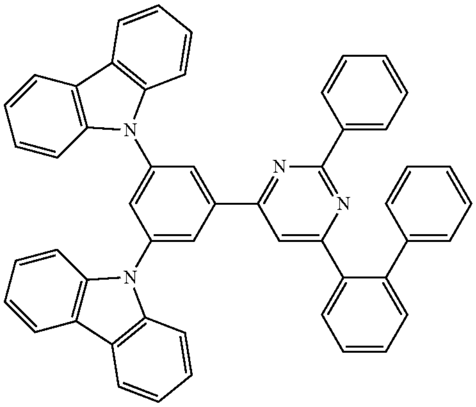
ET45
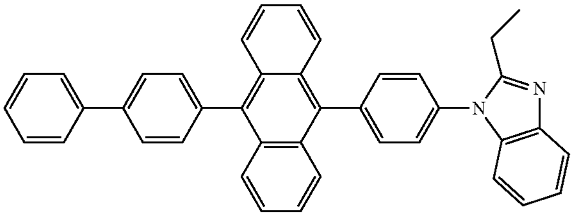

-continued

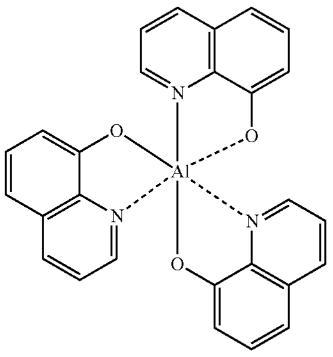

$Alq_3$

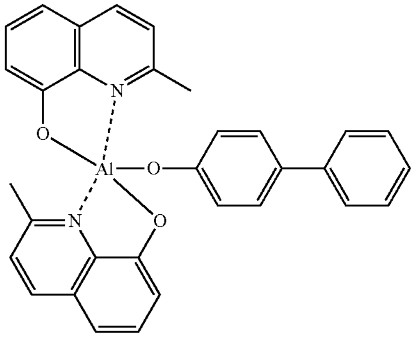

BAlq

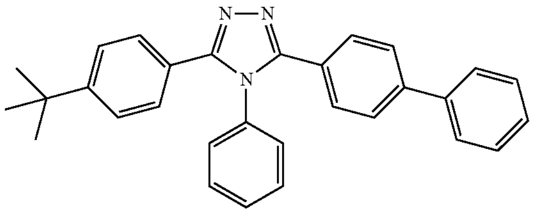

TAZ

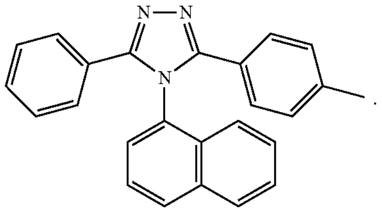

NTAZ

The thickness of the electron transport region may be in a range of about 100 Angstroms (Å) to about 5,000 Å, for example, about 160 Å to about 4,000 Å. When the electron transport region includes a buffer layer, a hole blocking layer, an electron transport layer, or any combination thereof, the thicknesses of the buffer layer and the hole blocking layer may each independently be in a range of about 20 Å to about 1,000 Å, for example, about 30 Å to about 300 Å, and the thickness of the electron transport layer may be in a range of about 100 Å to about 1,000 Å, for example, about 150 Å to about 500 Å. When the thickness of the buffer layer, the hole blocking layer, and/or the electron transport layer is within any of these ranges, excellent electron transport characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a lithium (Li) ion, a sodium (Na) ion, a potassium (K) ion, a rubidium (Rb) ion, or a cesium (Cs) ion. A metal ion of the alkaline earth metal complex may be a beryllium (Be) ion, a magnesium (Mg) ion, a calcium (Ca) ion, a strontium (Sr) ion, or a barium (Ba) ion. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, e.g., Compound ET-D1 (LiQ) or Compound ET-D2:

ET-D1

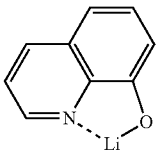

ET-D2

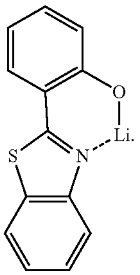

The electron transport region may include an electron injection layer that facilitates or perform electron injection. The electron injection layer may be in direct contact with the cathode 150.

The electron injection layer may have i) a single-layered structure consisting of a single layer consisting of a single material, ii) a single-layered structure consisting of a single layer including a plurality of different materials, or iii) a multi-layered structure having a plurality of layers including a plurality of different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may be Li, Na, K, Rb, Cs or any combination thereof. The alkaline earth metal may be Mg, Ca, Sr, Ba, or any combination thereof. The rare earth metal may be Sc, Y, Ce, Tb, Yb, Gd, or any combination thereof.

The alkali metal-containing compound, the alkaline earth metal-containing compound, and the rare earth metal-containing compound may respectively be oxides, halides (e.g., fluorides, chlorides, bromides, or iodides), tellurides, or any combination thereof of each of the alkali metal, the alkaline earth metal, and the rare earth metal.

The alkali metal-containing compound may be alkali metal oxides such as $Li_2O$, $Cs_2O$, or $K_2O$, alkali metal halides such as LiF, NaF, CsF, KF, LiI, NaI, CsI, or KI, or any combination thereof. The alkaline earth-metal-containing compound may include alkaline earth-metal oxides, such as BaO, SrO, CaO, $Ba_xSr_{1-x}O$ (wherein x is a real number satisfying 0<x<1), or $Ba_xCa_{1-x}O$ (wherein x is a real number satisfying 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In some embodiments, the rare earth metal-containing compound may include a lanthanide metal telluride. Examples of the lanthanide metal telluride include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth metal complex, and the rare earth metal complex may include: i) one of ions of the alkali metal, alkaline earth metal, and rare earth metal described above and ii) a ligand bond to the metal ion, e.g., hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In some embodiments, the electron injection layer may further include an organic material (e.g., a compound represented by Formula 601).

In some embodiments, the electron injection layer may consist of i) an alkali metal-containing compound (e.g., alkali metal halide), or ii) a) an alkali metal-containing compound (e.g., alkali metal halide); and b) an alkali metal, an alkaline earth metal, a rare earth metal, or any combination thereof. In some embodiments, the electron injection layer may be a KI:Yb co-deposition layer, a RbI:Yb co-deposition layer, and the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth metal complex, the rare earth metal complex, or any combination thereof may be homogeneously or non-homogeneously dispersed in a matrix including the organic material.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The cathode 150 will be described below in detail.

The cathode 150 may be on the active layer 130 or the electron transport region. A material for forming the cathode 150 may be a material with a low work function, such as a metal, an alloy, an electrically conductive compound, or any combination thereof.

The cathode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or any combination thereof. The cathode 150 may be a transmissive electrode, a semi-transmissive electrode, or a reflective electrode.

The cathode 150 may have a single-layered structure, or a multi-layered structure including two or more layers.

The capping layer will be described below in detail.

A first capping layer may be located outside the anode 110, and/or a second capping layer may be located outside the cathode 150.

The first capping layer and/or the second capping layer may prevent penetration of impurities, such as water or oxygen, to the organic photodetector 10 or 20 to thereby improve reliability of the organic photodetector 10 or 20.

The first capping layer and the second capping layer may each include a material having a refractive index of 1.6 or higher, e.g., at light of 589 nm wavelength.

The first capping layer and the second capping layer may each independently be a capping layer including an organic material, an inorganic capping layer including an inorganic material, or an organic-inorganic composite capping layer including an organic material and an inorganic material.

At least one of the first capping layer and the second capping layer may each independently include carbocyclic compounds, heterocyclic compounds, amine group-containing compounds, porphine derivatives, phthalocyanine derivatives, naphthalocyanine derivatives, alkali metal complexes, alkaline earth metal complexes, or any combination thereof. The carbocyclic compound, the heterocyclic compound, and the amine group-containing compound may optionally be substituted with a substituent of O, N, S, Se, Si, F, Cl, Br, I, or any combination thereof. In some embodiments, at least one of the first capping layer and the second capping layer may each independently include an amine group-containing compound.

In some embodiments, at least one of the first capping layer and the second capping layer may each independently include the compound represented by Formula 201, the compound represented by Formula 202, or any combination thereof.

In one or more embodiments, at least one of the first capping layer and the second capping layer may each independently include one of Compounds HT28 to HT33, one of Compounds CP1 to CP6, j-NPB, or any combination thereof.

CP1

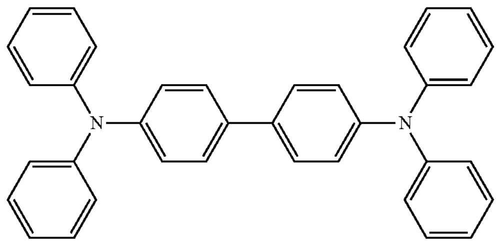

-continued

CP2

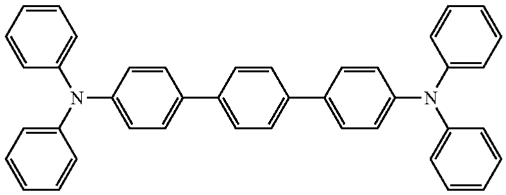

CP3

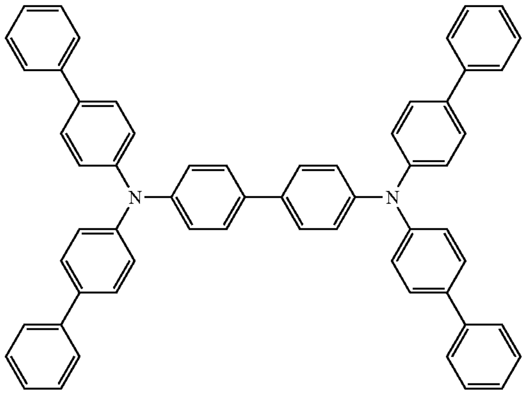

CP4

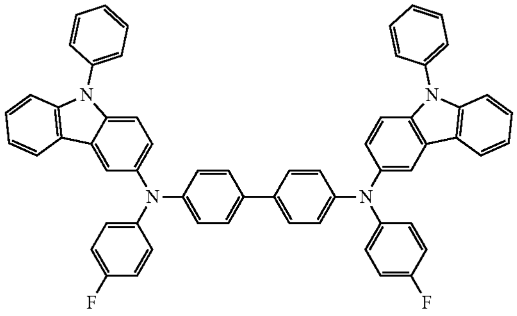

CP5

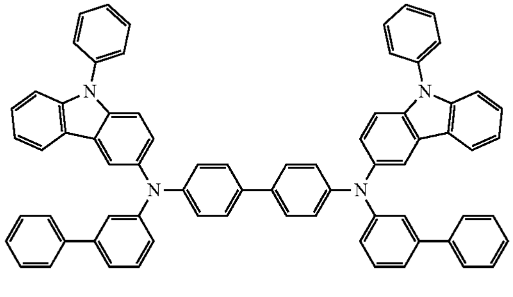

-continued

CP6

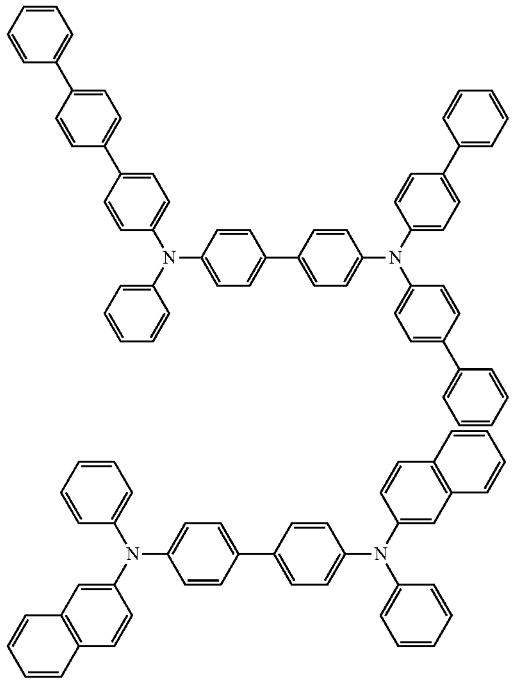

β-NPB

Figure 4:
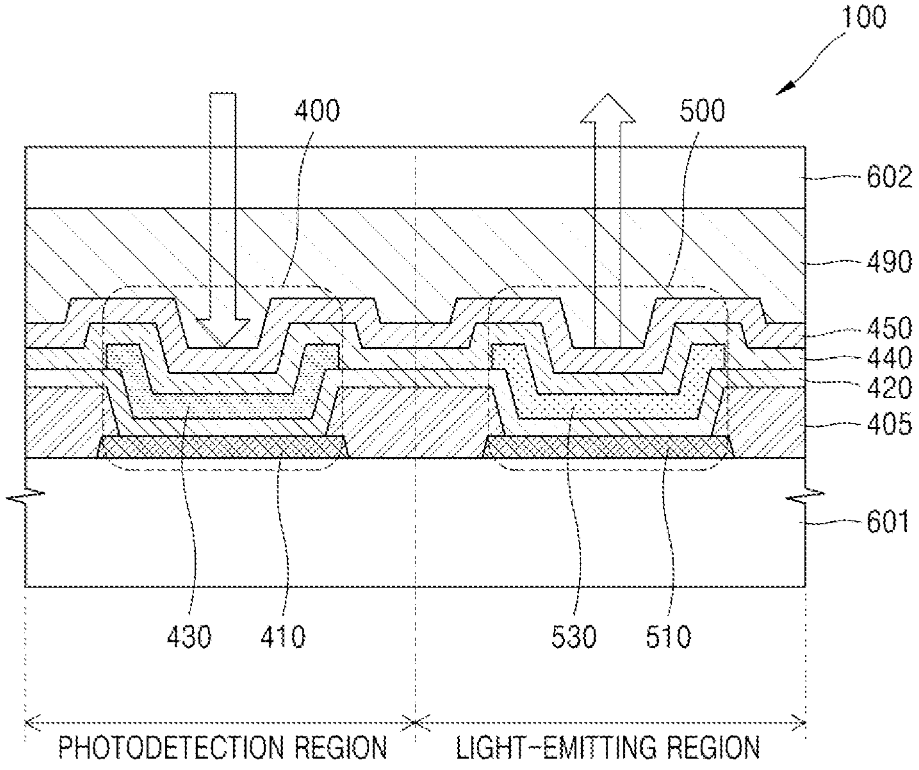
FIG. 4 is a cross sectional view of an embodiment of an electronic apparatus constructed according to the principles of the invention.
Figure 5:
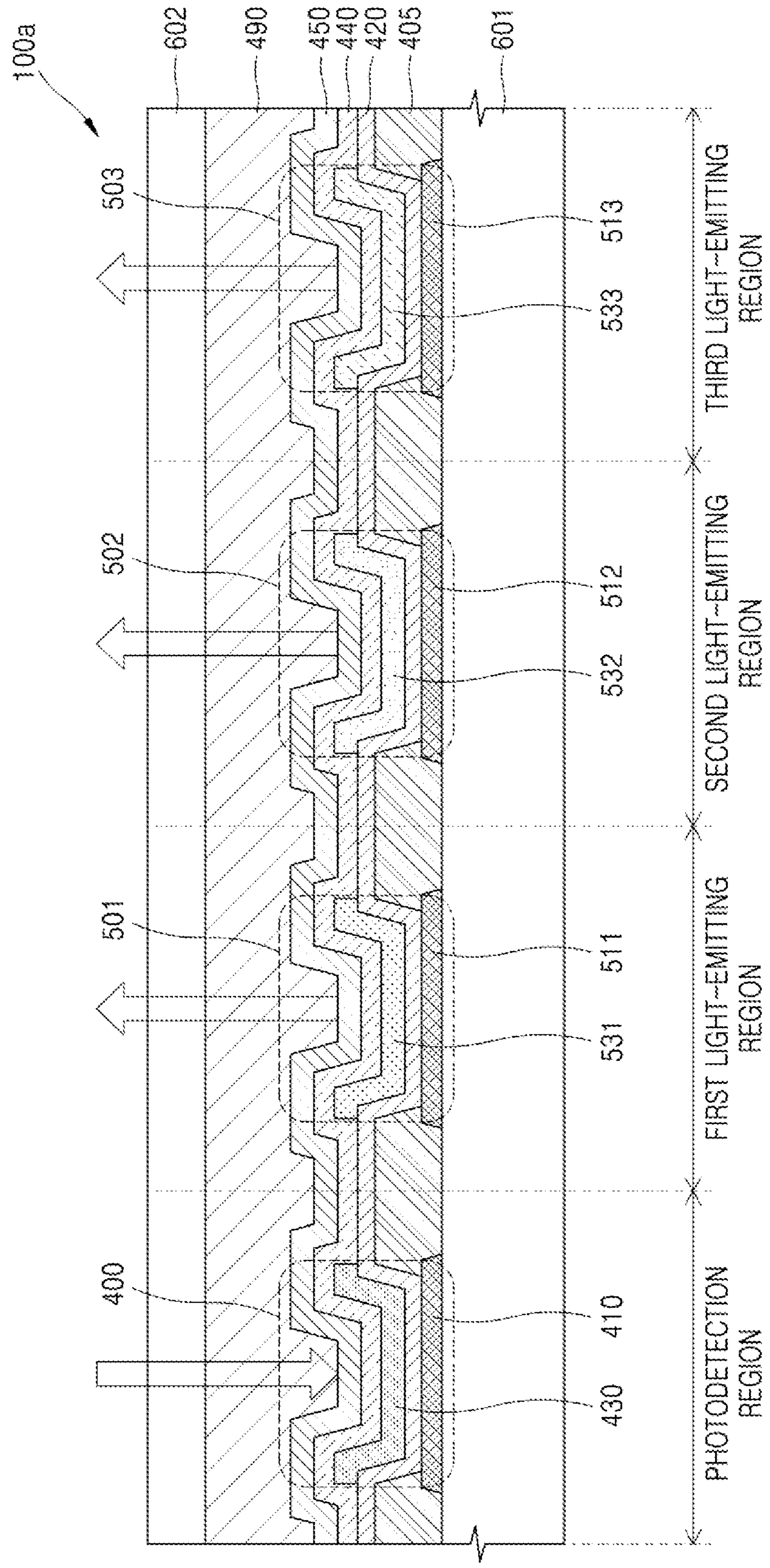
FIG. 5 is a cross sectional view of another embodiment of the electronic apparatus of FIG. 4.

Descriptions of FIGS. 4 and 5

FIG. 4 is a schematic view of an embodiment of an electronic apparatus 100.

As shown in FIG. 4, the electronic apparatus 100 may include an organic photodetector 400 and a light-emitting device 500 between a substrate 601 and a substrate 602.

The substrates 601 and 602 may each independently be a flexible substrate, a glass substrate, or a metal substrate. A buffer layer and a thin-film transistor may be on the substrate 601.

The buffer layer may prevent penetration of impurities through the substrate 601 and provide a flat surface on the substrate 601. The thin-film transistor may be on the buffer layer and may include an active layer, a gate electrode, a source electrode, and a drain electrode.

Such a thin-film transistor may be electrically connected to the light-emitting device 500 to drive the light-emitting device 500. One of the source electrode and drain electrode may be electrically connected to a second pixel electrode 510 of the light-emitting device 500.

Another thin-film transistor may be electrically connected to the organic photodetector 400. One of the source electrode and drain electrode may be electrically connected to a first pixel electrode 410 of the organic photodetector 400.

The organic photodetector 400 may include a first pixel electrode 410, a first common layer 420, an active layer 430, a second common layer 440, and a counter electrode 450.

In some embodiments, the first pixel electrode 410 may be an anode, and the counter electrode 450 may be a cathode. For example, by applying a reverse bias to a place between the first pixel electrode 410 and the counter electrode 450 to drive the organic photodetector 400, the electronic apparatus 100 may detect light incident on the organic photodetector 400, generate charges, and extract a current.

The light-emitting device 500 may include the second pixel electrode 510, the first common layer 420, an emission layer 530, the second common layer 440, and the counter electrode 450.

In some embodiments, the second pixel electrode 510 may be an anode, and the counter electrode 450 may be a cathode. For example, in the light-emitting device 500, holes injected from the second pixel electrode 510 and the electrons injected from the counter electrode 450 may recombine in the emission layer 530 to form excitons, and the excitons may transit from an excited state to a ground, thereby generating light.

Descriptions of the first pixel electrode 410 and the second pixel electrode 510 may each be understood by referring to the description of the anode 110 provided herein.

Pixel-defining films 405 may be formed on an edge of the first pixel electrode 410 and on an edge of the second pixel electrode 510. The pixel-defining film 405 may define a pixel region and may electrically insulate between the first pixel electrode 410 and the second pixel electrode 510. The pixel-defining film 405 may include, for example, one or more suitable organic insulating materials (e.g., a silicon-based material), inorganic insulating materials, or organic/inorganic composite insulating materials. The pixel-defining film 405 may be a transmissive film that may transmit visible light or a blocking film that may block visible light.

The first common layer 420 and the second common layer 440 may each be placed over the photodetection region and the light-emitting region. The first common layer 420 may include, for example, a hole injection layer, a hole transport layer, an electron blocking layer, or any combination thereof, and the second common layer 440 may include, for example, a buffer layer, a hole blocking layer, an electron transport layer, an electron injection layer, or any combination thereof.

In some embodiments, at least one of each layer included in the first common layer 420 and each layer included in the second common layer 440 may be placed to be corresponding to the photodetection region and the light-emitting region.

As such, in the electronic apparatus 100, by placing a common layer over the organic photodetector 400 and the light-emitting device 500, a manufacturing process may be reduced, and a functional layer material used in the light-emitting device 500 may also be used in the organic photodetector 400. Thus, the organic photodetector 400 may be disposed in-pixel in the electronic apparatus.

The active layer 430 may be disposed to be corresponding to the photodetection region on the first common layer 420. The active layer 430 may be understood by referring to the description of the active layer provided herein.

The emission layer 530 may be disposed to be corresponding to the light-emitting region on the first common layer 420. The emission layer 530 may be formed by using one or more known light-emitting materials. For example, as the light-emitting material, an organic material, an inorganic material, or a quantum dot may be used. In an embodiment, the light-emitting device 500 may further include an electron blocking layer, between the second pixel electrode 510 and the emission layer 530, corresponding to the light-emitting region.

The second common layer 440 and the counter electrode 450, each formed as a common layer for the photodetection region and first light-emitting region, may be sequentially on the active layer 430 and the emission layer 530. The counter electrode 450 may be understood by referring to the description of the cathode 150 provided herein.

A capping layer may be on the counter electrode 450. A material for forming the capping layer may include the organic material and/or the inorganic material described herein. The capping layer may protect the organic photodetector 400 and the light-emitting device 500 and assist effective light emission from the light-emitting device 500.

The encapsulation unit 490 may be on the capping layer. The encapsulation unit 490 may be on the organic photodetector 400 and the light-emitting device 500 to thereby protect the organic photodetector 400 and the light-emitting device 500 from water or oxygen. The encapsulation unit 490 may include: an inorganic film including silicon nitride ($SiN_x$), silicon oxide ($SiO_x$), indium tin oxide, indium zinc oxide, or any combination thereof, an organic film including polyethylene terephthalate, polyethylene naphthalate, polycarbonate, polyimide, polyethylene sulfonate, polyoxy methylene, poly aryllate, hexamethyl disiloxane, an acrylic resin (e.g., polymethyl methacrylate, polyacrylic acid, and the like), an epoxy resin (e.g., aliphatic glycidyl ether (AGE) and the like), or any combination thereof, or a combination of the inorganic film and the organic film.

The electronic apparatus 100 may be, for example, a display apparatus. As the electronic apparatus 100 includes the organic photodetector 400 and the light-emitting device 500, the electronic apparatus 100 may be a display apparatus capable of photodetection.

In FIG. 4, the electronic apparatus 100 is illustrated as including one light-emitting device 500. Further, as shown in FIG. 5, an electronic apparatus **100*a* according to one or more embodiments may include the organic photodetector 400, a first light-emitting device 501, a second light-emitting device 502, and a third light-emitting device 503**.

Components illustrated in FIG. 4 may be understood by referring to the descriptions of the components described in the electronic apparatus 100.

The first light-emitting device 501 may include the second pixel electrode 511, the first common layer 420, a first emission layer 531, the second common layer 440, and the counter electrode 450.

The second light-emitting device 502 may include a third pixel electrode 512, the first common layer 420, a second emission layer 532, the second common layer 440, and the counter electrode 450.

The third light-emitting device 503 may include a fourth pixel electrode 513, the first common layer 420, a third emission layer 533, the second common layer 440, and the counter electrode 450.

The second pixel electrode 511, the third pixel electrode 512, and the fourth pixel electrode 513 may respectively be disposed to correspond to the first light-emitting region, the second light-emitting region, and the third light-emitting region. The second pixel electrode 511, the third pixel electrode 512, and the fourth pixel electrode 513 may each be understood by referring to the description of the second pixel electrode 510.

The first emission layer 531 may be disposed to correspond to the first light-emitting region and emit first color light, the second emission layer 532 may be disposed to correspond to the second light-emitting region and emit second color light, and the third emission layer 533 may be disposed to correspond to the third light-emitting region and emit third color light.

A maximum emission wavelength of the first color light, a maximum emission wavelength of the second color light, and a maximum emission wavelength of the third color light may be identical to or different from each other. For example, a maximum emission wavelength of the first color light and a maximum emission wavelength of the second color light may each be longer than a maximum emission wavelength of the third color light.

In some embodiments, the first color light may be red light, the second color light may be green light, and the third color light may be blue light, but embodiments are not limited thereto. Thus, the electronic apparatus 100*a* may be capable of full color emission. When a mixed light of the first color light, the second color light, and the third color light is white light, the first color light, the second color light, and the third color light may not be respectively limited to the light, green light, and blue light.

The first emission layer 531, the second emission layer 532, and the third emission layer 533 may each be formed by using one or more known suitable light-emitting materials. For example, as the light-emitting material, an organic material, an inorganic material, or a quantum dot may be used.

The organic photodetector 400, the first light-emitting device 501, the second light-emitting device 502, and the third light-emitting device 503 may each be a sub-pixel, each forming a pixel. According to one or more embodiments, one pixel may include at least one organic photodetector 400.

The electronic apparatus 100*a* may be a display apparatus. As the electronic apparatus 100*a* may include the organic photodetector 400, the first light-emitting device 501, the second light-emitting device 502, and the third light-emitting device 503, the electronic apparatus 100*a* may be capable of performing light detection and full color emission.

Descriptions of FIGS. 6A and 6B will be provided below in detail.

Figure 6A:
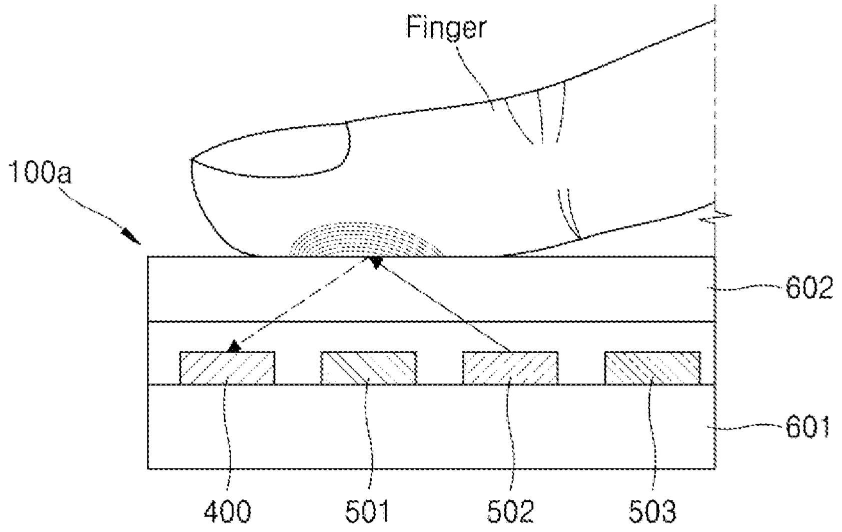
FIG. 6A is a cross sectional view of the electronic apparatus of FIG. 5 illustrating an object in contact with the electronic apparatus.

In the electronic apparatus 100*a* shown in FIG. 6A, the organic photodetector 400 and the first, second, and third light-emitting devices 501, 502, and 503 may be between the substrate 601 and the substrate 602.

For example, red light, green light, and blue light may respectively be emitted from the first light-emitting device 501, the second light-emitting device 502, and the third light-emitting device 503.

The electronic apparatus 100*a* according to one or more embodiments may be capable of detecting an object in contact with the electronic apparatus 100*a*, e.g., a fingerprint of a finger of a user. For example, as shown in FIG. 6A, at least some light emitted from the second light-emitting device 502 and reflected by a fingerprint of a finger may be re-incident on the organic photodetector 400. Thus, the organic photodetector 400 may detect the reflected light. A ridge in a fingerprint pattern of a finger may adhere to the substrate 602, and thus, the organic photodetector 400 may selectively obtain the fingerprint pattern of a finger, e.g., image information of the ridge. Although FIG. 6A shows an embodiment in which information of an object in contact with the electronic apparatus 100*a* is obtained by using light emitted from the second light-emitting device 502, light emitted from the first light-emitting device 501 and/or light emitted from the third light-emitting device 503 may also be used in the same manner when obtaining information by using emitted light.

Figure 6B:
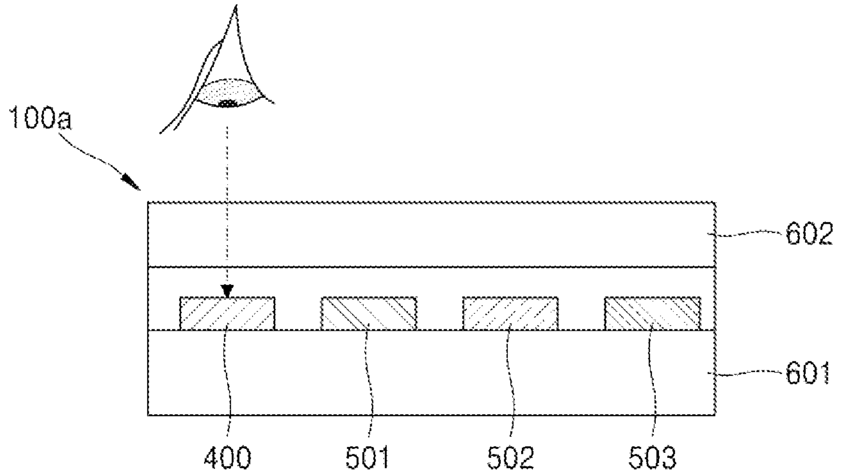
FIG. 6B is a cross sectional view of the electronic apparatus of FIG. 5 illustrating an object that is not in contact with the electronic apparatus.

As shown in FIG. 6B, the electronic apparatus 100*a* according to one or more embodiments may detect an object that is not in contact with the electronic apparatus 100*a*.

Manufacturing method will be described below in detail.

The layers constituting the hole transport region, the active layer, and the layers constituting the electron transport region may be formed in a specific region by using one or more suitable methods such as vacuum deposition, spin coating, casting, Langmuir-Blodgett (LB) deposition, ink-jet printing, laser printing, and laser-induced thermal imaging.

When layers constituting the hole transport region, an active layer, and layers constituting the electron transport region are each independently formed by vacuum-deposition, the vacuum-deposition may be performed at a deposition temperature in a range of about 100° C. to about 500° C., at a vacuum degree in a range of about $10^{-8}$ torr to about $10^{-3}$ torr, and at a deposition rate in a range of about 0.01 Angstroms per second (Å/sec) to about 100 Å/sec, depending on the material to be included in each layer and the structure of each layer to be formed.

General definitions of terms will be provided below in detail.

The term "$C_3$-$C_{60}$ carbocyclic group" as used herein refers to a cyclic group consisting of carbon atoms only and having 3 to 60 carbon atoms as ring-forming atoms. The term "$C_1$-$C_{60}$ heterocyclic group" as used herein refers to a cyclic group having 1 to 60 carbon atoms in addition to a heteroatom as ring-forming atoms other than carbon atoms. The $C_3$-$C_{60}$ carbocyclic group and the $C_1$-$C_{60}$ heterocyclic group may each be a monocyclic group consisting of one ring or a polycyclic group in which at least two rings are condensed. For example, the number of ring-forming atoms in the $C_1$-$C_{60}$ heterocyclic group may be in a range of 3 to 61.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" refers to a cyclic group having 3 to 60 carbon atoms and not including *—N=*' as a ring-forming moiety. The term "R electron-deficient nitrogen-containing $C_1$-$C_{60}$ cyclic group" as used herein refers to a heterocyclic group having 1 to 60 carbon atoms and *—N=*' as a ring-forming moiety.

In some embodiments, the $C_3$-$C_{60}$ carbocyclic group may be i) a T1 group or ii) a group in which at least two T1 groups are condensed (for example, a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a T2 group, ii) a group in which at least two T2 groups are condensed, or iii) a group in which at least one T2 group is condensed with at least one T1 group (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), the π electron-rich $C_3$-$C_{60}$ cyclic group may be i) a T1 group, ii) a condensed group in which at least two T1 groups are condensed, iii) a T3 group, iv) a condensed group in which at least two T3 groups are condensed, or v) a condensed group in which at least one T3 group is condensed with at least one T1 group (for example, a $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonapthothiophene group, a benzonaphthosilole group, a benzofurodibenzofuran group, a benzofurodibenzothiophene group, a benzothienodibenzothiophene group, and the like), and the π electron-deficient nitrogen-containing $C_1$-$C_{60}$ cyclic group may be i) a T4 group, ii) a group in which at least two T4 groups are condensed, iii) a group in which at least one T4 group is condensed with at least one T1 group, iv) a group in which at least one T4 group is condensed with at least one T3 group, or v) a group in which at least one T4 group, at least one T1 group, and at least one T3 group are condensed (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, and the like), wherein the T1 group may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or bicyclo[2.2.1]heptane) group, a norbornene group, a bicyclo[1.1.1]pentane group, a bicyclo[2.1.1]hexane group, a bicyclo[2.2.2]octane group, or a benzene group, the T2 group may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, the T3 group may be a furan group, a thiophene group, a 1H-pyrrole group, a silole group, or a borole group, and the T4 group may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The term "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may be a group condensed with any suitable cyclic group, a monovalent group, or a polyvalent group (e.g., a divalent group, a trivalent group, a quadvalent group, or the like), depending on the structure of the formula to which the term is applied. For example, a "benzene group" may be a benzene ring, a phenyl group, a phenylene group, or the like, and this may be understood by one of ordinary skill in the art, depending on the structure of the formula including the "benzene group".

In some embodiments, examples of the monovalent $C_3$-$C_{60}$ carbocyclic group and monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The "$C_1$-$C_{60}$ alkyl group" as used herein refers to a linear or branched aliphatic hydrocarbon monovalent group having 1 to 60 carbon atoms. Examples of the $C_1$-$C_{60}$ alkyl group include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, and a tert-decyl group. The term "$C_1$-$C_{60}$ alkylene group" as used herein refers to a divalent group having substantially the same structure as the $C_1$-$C_{60}$ alkyl group.

The term "$C_2$-$C_{60}$ alkenyl group" as used herein refers to a hydrocarbon group having at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having substantially the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having substantially the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is a $C_1$-$C_{60}$ alkyl group). Examples thereof include a methoxy group, an ethoxy group, and an isopropyloxy group.

The term "$C_3$-$C_{10}$ cycloalkyl group" as used herein refers to a monovalent saturated hydrocarbon monocyclic group including 3 to 10 carbon atoms. Examples of the $C_3$-$C_{10}$ cycloalkyl group as used herein include a cyclopropyl group, a cyclobutyl group, a cyclopentyl group, a cyclohexyl group, a cycloheptyl group, a cyclooctyl group, an adamantyl group, a norbornyl (bicyclo[2.2.1]heptyl) group, a bicyclo[1.1.1]pentyl group, a bicyclo[2.1.1]hexyl group, or a bicyclo[2.2.2]octyl group. The term "$C_3$-$C_{10}$ cycloalkylene group" as used herein refers to a divalent group having substantially the same structure as the $C_3$-$C_{10}$ cycloalkyl group.

The term "$C_1$-$C_{10}$ heterocycloalkyl group" as used herein refers to a monovalent cyclic group including at least one heteroatom other than carbon atoms as a ring-forming atom and having 1 to 10 carbon atoms. Examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having substantially the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in its ring, and is not aromatic. Examples thereof include a cyclopentenyl group, a cyclohexenyl group, and a cycloheptenyl group. The term "$C_3$-$C_{10}$ cycloalkenylene group" as used herein refers to a divalent group having substantially the same structure as the $C_3$-$C_{10}$ cycloalkenyl group.

The term "$C_1$-$C_{10}$ heterocycloalkenyl group" as used herein refers to a monovalent cyclic group including at least one heteroatom other than carbon atoms as a ring-forming atom, 1 to 10 carbon atoms, and at least one double bond in its ring. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkylene group" as used herein refers to a divalent group having substantially the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each independently include two or more rings, the respective rings may be fused.

The term "$C_1$-$C_{60}$ heteroaryl group" as used herein refers to a monovalent group having a heterocyclic aromatic system further including at least one heteroatom other than carbon atoms as a ring-forming atom and 1 to 60 carbon atoms. The term "$C_1$-$C_{60}$ heteroarylene group" as used herein refers to a divalent group having a heterocyclic aromatic system further including at least one heteroatom other than carbon atoms as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each independently include two or more rings, the respective rings may be fused.

The term "monovalent non-aromatic condensed polycyclic group" as used herein refers to a monovalent group having two or more rings condensed and only carbon atoms (for example, having 8 to 60 carbon atoms) as ring-forming atoms. For example, the molecular structure as a whole is non-aromatic. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group having two or more rings condensed and carbon atoms (for example, having 1 to 60 carbon atoms) and at least one heteroatom as ring-forming atoms. For example, the molecular structure as a whole is non-aromatic. Examples of the monovalent non-aromatic condensed heteropolycyclic group may include a 9,9-dihydroacridinyl group and a 9H-xanthenyl group. The term "divalent non-aromatic condensed heteropolycyclic group" as used herein refers to a divalent group having substantially the same structure as the monovalent non-aromatic condensed heteropolycyclic group.

The term "$C_6$-$C_{60}$ aryloxy group" as used herein refers to —$OA_{102}$ (wherein $A_{102}$ is a $C_6$-$C_{60}$ aryl group). The term "$C_6$-$C_{60}$ arylthio group" as used herein refers to —$SA_{103}$ (wherein $A_{103}$ is a $C_6$-$C_{60}$ aryl group).

The term "$C_7$-$C_{60}$ aryl alkyl group" as used herein refers to -$A_{104}A_{105}$ (wherein $A_{104}$ is a $C_1$-$C_{54}$ alkylene group, and $A_{105}$ is a $C_6$-$C_{59}$ aryl group). The term "$C_2$-$C_{60}$ heteroaryl alkyl group" as used herein refers to -$A_{106}A_{107}$ (wherein $A_{106}$ is a $C_1$-$C_{59}$ alkylene group, and $A_{107}$ is a $C_1$-$C_{59}$ heteroaryl group).

The term "$R_{10a}$" as used herein may be:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{11})(Q_{12})(Q_{13})$, —$N(Q_{11})(Q_{12})$, —$B(Q_{11})(Q_{12})$, —$C(=O)(Q_{11})$, —$S(=O)_2(Q_{11})$, —$P(=O)(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —$Si(Q_{21})(Q_{22})(Q_{23})$, —$N(Q_{21})(Q_{22})$, —$B(Q_{21})(Q_{22})$, —$C(=O)(Q_{21})$, —$S(=O)_2(Q_{21})$, —$P(=O)(Q_{21})(Q_{22})$, or any combination thereof, or —$Si(Q_{31})(Q_{32})(Q_{33})$, —$N(Q_{31})(Q_{32})$, —$B(Q_{31})(Q_{32})$, —$C(=O)(Q_{31})$, —$S(=O)_2(Q_{31})$, or —$P(=O)(Q_{31})(Q_{32})$.

$Q_1$ to $Q_3$, $Q_{11}$ to $Q_{13}$, $Q_{21}$ to $Q_{23}$, and $Q_{31}$ to $Q_{33}$ may each independently be:

hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, a $C_7$-$C_{60}$ aryl alkyl group; or a $C_2$-$C_{60}$ heteroaryl alkyl group.

The term "heteroatom" as used herein refers to any atom other than a carbon atom. Examples of the heteroatom may include O, S, N, P, Si, B, Ge, Se, or any combination thereof.

A third-row transition metal as used herein may include hafnium (Hf), tantalum (Ta), tungsten (W), rhenium (Re), osmium (Os), iridium (Ir), platinum (Pt), and gold (Au).

The term "Ph" used herein represents a phenyl group, the term "Me" used herein represents a methyl group, the term "Et" used herein represents an ethyl group, the term "ter-Bu" or "$Bu^t$" used herein represents a tert-butyl group, and the term "OMe" used herein represents a methoxy group.

The term "biphenyl group" as used herein refers to a phenyl group substituted with a phenyl group. The "biphenyl group" belongs to "a substituted phenyl group" having a "$C_6$-$C_{60}$ aryl group" as a substituent.

The term "terphenyl group" as used herein refers to a phenyl group substituted with a biphenyl group. The "terphenyl group" belongs to "a substituted phenyl group" having a "$C_6$-$C_{60}$ aryl group substituted with a $C_6$-$C_{60}$ aryl group" as a substituent.

Various examples will be described below in detail.

Comparative Example 1 will be described below in detail.

An ITO glass substrate was cut to a size of 50 millimeters (mm)×50 mm×0.5 mm, sonicated in isopropyl alcohol and pure water for 10 minutes in each solvent, and cleaned by exposure to ultraviolet rays with ozone for 10 minutes to use the glass substrate as an anode. Then, the glass substrate was mounted to a vacuum-deposition apparatus. HT3 was vacuum-deposited on the anode to form a hole transport layer having a thickness of 1,300 Å.

SubPC was deposited on the hole transport layer to form a donor layer having a thickness of 150 Å, and $C_{60}$ was deposited on the donor layer to form an acceptor layer having a thickness of 300 Å, thereby forming an active layer.

Then, BCP was vacuum-deposited on the acceptor layer to form a buffer layer having a thickness of 50 Å, and $Alq_3$ and LiQ were co-deposited on the buffer layer to form an electron transport layer having a thickness of 310 Å.

Ag and Mg were co-deposited on the electron transport layer to form a cathode having a thickness of 100 Å, thereby completing the manufacture of an organic photodetector.

HT3

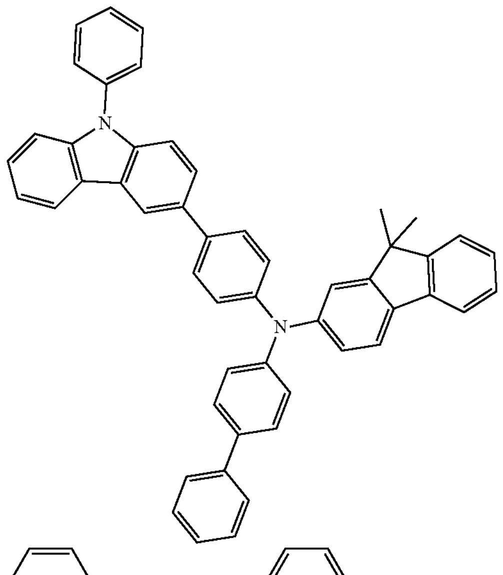

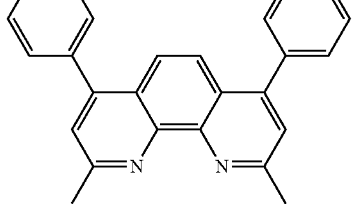

BCP

-continued

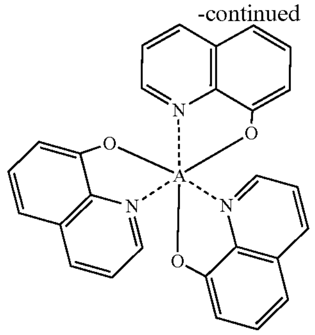

Alq3

Example 1 will be described below in detail.

An organic photodetector was manufactured in the same manner as in Comparative Example 1, except that SubPc was deposited on the acceptor layer to additionally form a donor layer (e.g., a second layer) having a thickness of 50 Å.

Evaluation Example: Measurement of J-V and external quantum efficiency of organic photodetectors, will be described below in detail.

Figure 7:
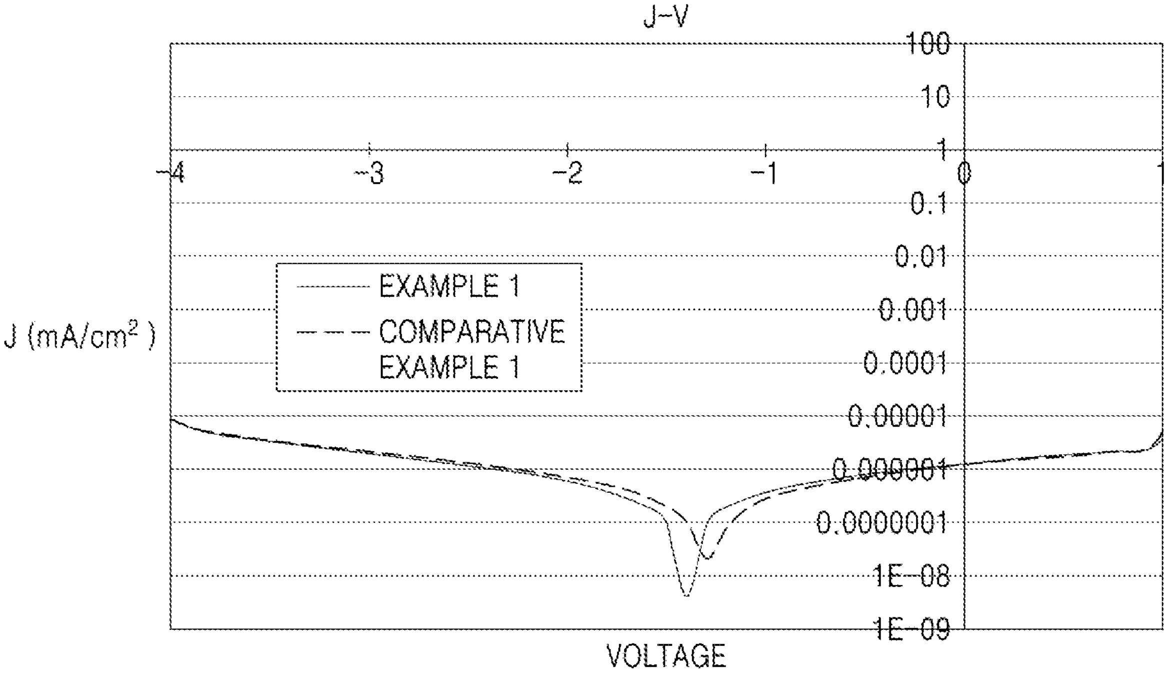
FIG. 7 is a graph of voltage versus current density (a J-V curve) of organic photodetectors manufactured in Comparative Example 1 and Example 1.
Figure 8:
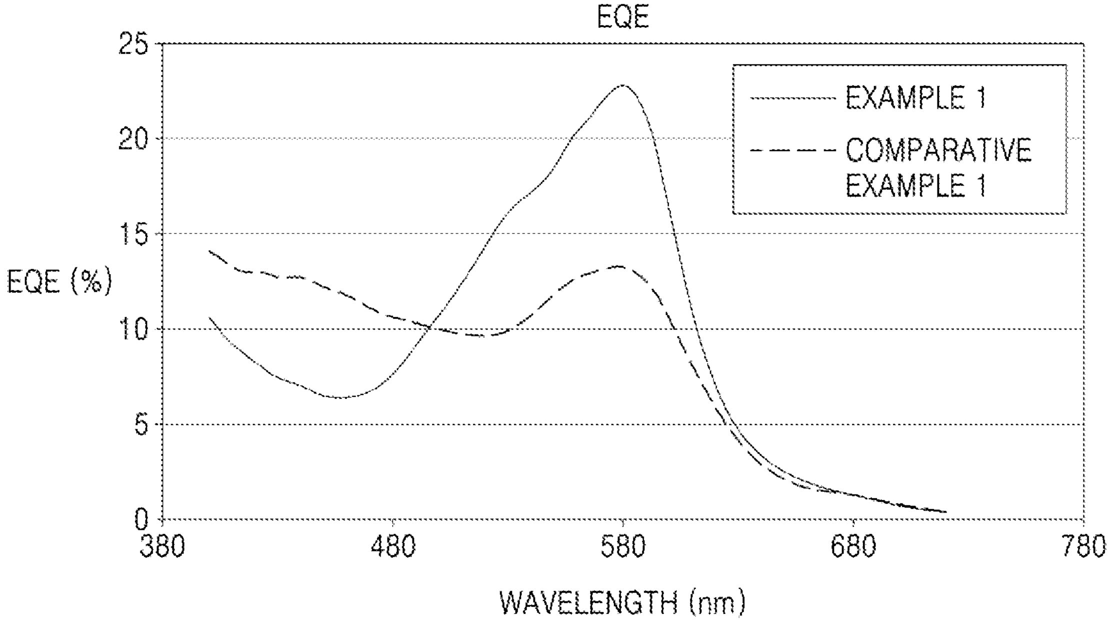
FIG. 8 is a graph of wavelength versus external quantum efficiency (EQE) of organic photodetectors manufactured in Comparative Example 1 and Example 1.

The current density-voltage curve (a J-V curve) and external quantum efficiency (EQE) according to wavelength of the organic photodetectors manufactured in Comparative Example 1 and Example 1 were measured and shown in FIGS. 7 and 8. By using an EQE measurement system, a current value was measured by using a current meter when light is incident on an organic photodetector to thereby measure and calculate the EQE value.

Referring to the results shown in FIG. 7, at a reverse bias of −3 V, the organic photodetectors of Comparative Example 1 and Example 1 respectively show a dark current density in a range of about $1\times10^{-6}$ mA/cm$^2$ to $2\times10^{-6}$ mA/cm$^2$. The results thereof were not substantially different.

Referring to the results of FIG. 8, the organic photodetectors of Comparative Example 1 and Example 1 respectively show the external quantum efficiency (EQE) of about 13% and about 23% at a wavelength of 580 nm. Thus, the organic photodetector of Example 1 was found to have EQE improvement of about 77%, as compared with the organic photodetector of Comparative Example 1.

As apparent from the foregoing description, the organic photodetector according to one or more embodiments is found to have a low dark current density and improved EQE and may have excellent photodetection characteristics.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic photodetector comprising:

an anode;

a cathode facing the anode;

an active layer disposed between the anode and the cathode, the active layer comprising a first layer and a second layer;

a hole transport region disposed between the anode and the active layer; and the hole transport region comprises a hole transport layer, wherein:

the first layer is disposed between the anode and the second layer, the first layer comprises a p-type organic semiconductor and an n-type organic semiconductor, and the second layer consists only of the p-type organic semiconductor.

2. The organic photodetector of claim 1, wherein the n-type organic semiconductor has a lowest unoccupied molecular orbital (LUMO) energy level lower than that of the p-type organic semiconductor.

3. The organic photodetector of claim 1, wherein a lowest unoccupied molecular orbital (LUMO) energy level of the p-type organic semiconductor is in a range of about −4.0 electron volts (eV) to about −2.9 eV, and a LUMO energy level of the n-type organic semiconductor is in a range of about −4.5 eV to about −3.5 eV.

4. The organic photodetector of claim 1, wherein the p-type organic semiconductor consists of boron subphthalocyanine chloride (SubPc), copper(II) phthalocyanine (CuPc), tetraphenyldibenzoperiflanthene (DBP), or any combination thereof.

5. The organic photodetector of claim 1, wherein the n-type organic semiconductor comprises C60 fullerene, C70 fullerene, or any combination thereof.

6. The organic photodetector of claim 1, wherein the first layer comprises a mixed layer of the p-type organic semiconductor and the n-type organic semiconductor.

7. The organic photodetector of claim 1, wherein:

the first layer comprises a bilayer comprising a first donor layer and a first acceptor layer, the first acceptor layer is disposed between the first donor layer and the second layer, the first donor layer comprises the p-type organic semiconductor, and the first acceptor layer comprises the n-type organic semiconductor.

8. The organic photodetector of claim 7, wherein:

the first donor layer and the first acceptor layer form a PN junction, and the first acceptor layer and the second layer form a PN junction.

9. The organic photodetector of claim 7, wherein the p-type organic semiconductor comprised in the first donor layer is substantially identical to the p-type organic semiconductor comprised in the second layer.

10. The organic photodetector of claim 9, wherein the p-type organic semiconductor comprises SubPc, CuPc, DBP, or any combination thereof.

11. The organic photodetector of claim 7, wherein:

a thickness of the first donor layer is in a range of about 10 Angstroms (Å) to about 1,000 Å, a thickness of the first acceptor layer is in a range of about 10 Å to about 1,000 Å, and a thickness of the second layer is in a range of about 5 Å to about 200 Å.

12. The organic photodetector of claim 1, further comprising:

an electron transport region disposed between the active layer and the cathode, wherein:

the electron transport region comprises a buffer layer, a hole blocking layer, an electron transport layer, an electron injection layer, or any combination thereof.

13. The organic photodetector of claim 12, wherein:

the hole transport layer comprises a compound represented by Formula 201, a compound represented by Formula 202, or any combination thereof:

Formula 201

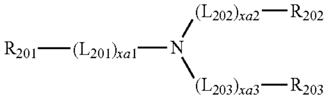

Formula 202

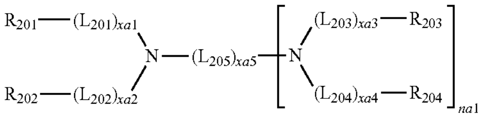

wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be bound to each other via a single bond, a $C_1$-$C_5$ alkylene group unsubstituted or substituted with at least one $R_{10a}$, or a $C_2$-$C_5$ alkenylene group unsubstituted or substituted with at least one $R_{10a}$ to form a $C_8$-$C_{60}$ polycyclic group unsubstituted or substituted with at least one $R_{10a}$, $R_{203}$ and $R_{204}$ may optionally be bound to each other via a single bond, a $C_1$-$C_5$ alkylene group unsubstituted or substituted with at least one $R_{10a}$ or a $C_2$-$C_5$ alkenylene group unsubstituted or substituted with at least one $R_{10a}$ to form a $C_8$-$C_{60}$ polycyclic group unsubstituted or substituted with at least one $R_{10a}$, and na1 may be an integer from 1 to 4, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, or a $C_2$-$C_{60}$ heteroaryl alkyl group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, a $C_7$-$C_{60}$ aryl alkyl group, a $C_2$-$C_{60}$ heteroaryl alkyl group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof; a $C_7$-$C_{60}$ aryl alkyl group; or a $C_2$-$C_{60}$ heteroaryl alkyl group.

14. The organic photodetector of claim 12, wherein:

the electron transport region comprises a buffer layer, and the buffer layer and the active layer are in direct contact with each other.

15. The organic photodetector of claim 14, wherein the p-type organic semiconductor comprised in the second layer has a lowest unoccupied molecular orbital (LUMO) energy level between a LUMO energy level of the n-type organic semiconductor and a LUMO energy level of a material comprised in the buffer layer.

16. The organic photodetector of claim 1, wherein a dark current density is about $10^{-5}$ milliamperes per square centimeter (mA/cm$^2$) or lower at a reverse bias of about −3 volts (V).

17. An electronic apparatus comprising the organic photodetector of claim 1.

18. The electronic apparatus of claim 17, further comprising a light-emitting device.

19. The electronic apparatus of claim 17, further comprising a thin-film transistor.

20. An electronic apparatus comprising:

a substrate comprising a photodetection region and a light-emitting region;

an organic photodetector disposed on the photodetection region; and a light-emitting device disposed on the light-emitting region, wherein the organic photodetector comprises:

a first pixel electrode;

a counter electrode facing the first pixel electrode; and a first common layer, an active layer, and a second common layer sequentially arranged between the first pixel electrode and the counter electrode, wherein the active layer comprises a first layer and a second layer, the first layer disposed between the first pixel electrode and the second layer, wherein:

the first layer comprises a p-type organic semiconductor and an n-type organic semiconductor, and the second layer consists only of the p-type organic semiconductor, wherein the light-emitting device comprises:

a second pixel electrode;

a counter electrode facing the second pixel electrode;

and the first common layer, an emission layer, and the second common layer sequentially disposed between the second pixel electrode and the counter electrode, and wherein:

the first pixel electrode and the active layer correspond to the photodetection region, the second pixel electrode and the emission layer correspond to the light-emitting region, and the first common layer, the second common layer, and the counter electrode correspond to the photodetection region and the light-emitting region as a whole.

* * * * *